United States Patent
Lee et al.

(10) Patent No.: US 10,424,577 B2
(45) Date of Patent: Sep. 24, 2019

(54) SEMICONDUCTOR DEVICES

(71) Applicant: SAMSUNG ELECTRONICS CO., LTD., Suwon-si (KR)

(72) Inventors: Inhak Lee, Daegu (KR); Sang-Yeop Baeck, Yongin-si (KR); JaeSeung Choi, Hwaseong-si (KR); Hyunsu Choi, Suwon-si (KR); SangShin Han, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 15/842,995

(22) Filed: Dec. 15, 2017

(65) Prior Publication Data
US 2018/0294256 A1   Oct. 11, 2018

(30) Foreign Application Priority Data
Apr. 6, 2017   (KR) .................. 10-2017-0044757

(51) Int. Cl.
| | |
|---|---|
| H01L 27/02 | (2006.01) |
| H01L 27/092 | (2006.01) |
| H01L 27/11 | (2006.01) |
| H01L 23/522 | (2006.01) |
| H01L 23/528 | (2006.01) |
| H01L 21/8238 | (2006.01) |
| G06F 17/50 | (2006.01) |
| H01L 29/78 | (2006.01) |

(52) U.S. Cl.
CPC ...... *H01L 27/0207* (2013.01); *G06F 17/5081* (2013.01); *H01L 21/823821* (2013.01); *H01L 21/823871* (2013.01); *H01L 23/5226* (2013.01); *H01L 23/5286* (2013.01); *H01L 27/0924* (2013.01); *H01L 27/1104* (2013.01); *H01L 29/7848* (2013.01)

(58) Field of Classification Search
CPC ... H01L 21/0207; H01L 27/11; H01L 23/528; H01L 23/5286; G11C 8/16
See application file for complete search history.

(56) References Cited

U.S. PATENT DOCUMENTS

| | | | |
|---|---|---|---|
| 6,946,692 B1* | 9/2005 | Hsu | H01L 23/5226 257/211 |
| 7,005,694 B2* | 2/2006 | Amo | G11C 15/043 257/296 |
| 7,038,926 B2 | 5/2006 | Jeong et al. | |

(Continued)

*Primary Examiner* — Matthew L Reames
*Assistant Examiner* — John A Bodnar
(74) *Attorney, Agent, or Firm* — Sughrue Mion, PLLC

(57) ABSTRACT

A semiconductor device including memory cell transistors on a substrate is provided. The semiconductor device includes a first wiring layer on the memory cell transistors and including a bit line and a first conductive pattern, a second wiring layer on the first wiring layer and including a ground line, a first via interposed between and electrically connecting the bit line and a source/drain of a first memory cell transistor among the memory cell transistors, and a first extended via interposed between the ground line and a source/drain of a second memory cell transistor among the memory cell transistors. The ground line is electrically connected to the source/drain of the second memory cell transistor through the first extended via and the first conductive pattern. The first extended via has a width greater than that of the first via.

10 Claims, 34 Drawing Sheets

(56) References Cited

U.S. PATENT DOCUMENTS

| | | |
|---|---|---|
| 7,425,720 B2 | 9/2008 | Kaeriyama et al. |
| 9,171,586 B2 | 10/2015 | Chi |
| 9,490,263 B2 | 11/2016 | Jeon et al. |
| 2004/0036088 A1* | 2/2004 | Tsukamoto ............. G11C 8/16 257/204 |
| 2005/0017284 A1* | 1/2005 | Amo ................... G11C 15/043 257/301 |
| 2005/0045919 A1 | 3/2005 | Kaeriyama et al. |
| 2005/0083765 A1* | 4/2005 | Jeong ...................... G11C 8/16 365/230.05 |
| 2011/0235407 A1 | 9/2011 | Lim et al. |
| 2014/0015061 A1* | 1/2014 | Pelley .................... G11C 7/18 257/369 |
| 2014/0159158 A1 | 6/2014 | Kim et al. |
| 2014/0185365 A1* | 7/2014 | Liaw ...................... G11C 8/16 365/154 |
| 2014/0299941 A1 | 10/2014 | Paul |
| 2015/0084097 A1 | 3/2015 | Jeon et al. |
| 2015/0235674 A1 | 8/2015 | Chi |
| 2016/0063166 A1 | 3/2016 | Hsieh et al. |
| 2016/0372477 A1 | 12/2016 | Funane |

\* cited by examiner

SEMICONDUCTOR DEVICES

CROSS-REFERENCE TO RELATED APPLICATION

This application claims priority from Korean Patent Application No. 10-2017-0044757 filed on Apr. 6, 2017, the disclosure of which is hereby incorporated by reference in its entirety.

BACKGROUND

Methods and apparatuses consistent with exemplary embodiments relate to a semiconductor device, and more particularly, to a semiconductor device including a field effect transistor and a method of manufacturing the same.

A semiconductor device may be used to implement a semiconductor memory device storing logic data, a semiconductor logic device processing operations of logic data, and a hybrid semiconductor device having both memory and logic elements. The semiconductor device has been increasingly integrated with various devices due to the advanced development of the electronic industry. Research is being conducted to improve reliability, speed, and functionality, resulting in increasingly complicated and highly integrated semiconductor devices.

SUMMARY

One or more exemplary embodiments provide a semiconductor device including a field effect transistor that has enhanced electrical characteristics.

According to an aspect of an exemplary embodiment, there is provided a semiconductor device including memory cell transistors on a substrate; a first wiring layer disposed on the memory cell transistors and including a bit line and a first conductive pattern; a second wiring layer disposed on the first wiring layer and including a ground line; a first via interposed between and electrically connecting the bit line and a source/drain of a first memory cell transistor among the memory cell transistors; and a first extended via interposed between the ground line and a source/drain of a second memory cell transistor among the memory cell transistors. The ground line is electrically connected to the source/drain of the second memory cell transistor through the first extended via and the first conductive pattern. A width of the first extended via is greater than a width of the first via.

According to an aspect of another exemplary embodiment, there is provided a semiconductor device including: a plurality of bit cells on a substrate, the plurality of bit cells including a first bit cell, a second bit cell, a third bit cell and a fourth bit cell. The first bit cell and the second bit cell are adjacent to each other in a first direction, the first bit cell and the third bit cell are adjacent to each other in a second direction crossing the first direction, the third bit cell and the fourth bit cell are adjacent to each other in the first direction, the second bit cell and the fourth bit cell are adjacent to each other in the second direction, each of the plurality of bit cells includes a plurality of transistors, the plurality of transistors including: a first access transistor and a second access transistor; a first pull-up transistor and a second pull-up transistor; and a first pull-down transistor and a second pull-down transistor, the first access transistor of the first bit cell and the first access transistor of the second bit cell are connected to a bit line through a first via, the second pull-down transistor of the first bit cell, the second pull-down transistor of the second bit cell, the second pull-down transistor of the third bit cell, the second pull-down transistor of the fourth bit cell are connected to a ground line through a first extended via, and the first extended via is wider than the first via.

According to an aspect of yet another exemplary embodiment, there is provided a semiconductor device including: a plurality of bit cells disposed on a substrate, the plurality of bit cells including a first bit cell, a second bit cell, a third bit cell and a fourth bit cell. Each of the plurality of bit cells includes a plurality of transistors, the plurality of transistors includes an access transistor and a pull-down transistor, the access transistor of the first bit cell and the access transistor of the second bit cell are connected to a bit line through a first via, the pull-down transistor of the first bit cell, the pull-down transistor of the second bit cell, the pull-down transistor of the third bit cell, the pull-down transistor of the fourth bit cell are connected to a ground line through a first extended via, and the first extended via is wider than the first via.

DETAILED DESCRIPTION

Figure 1:
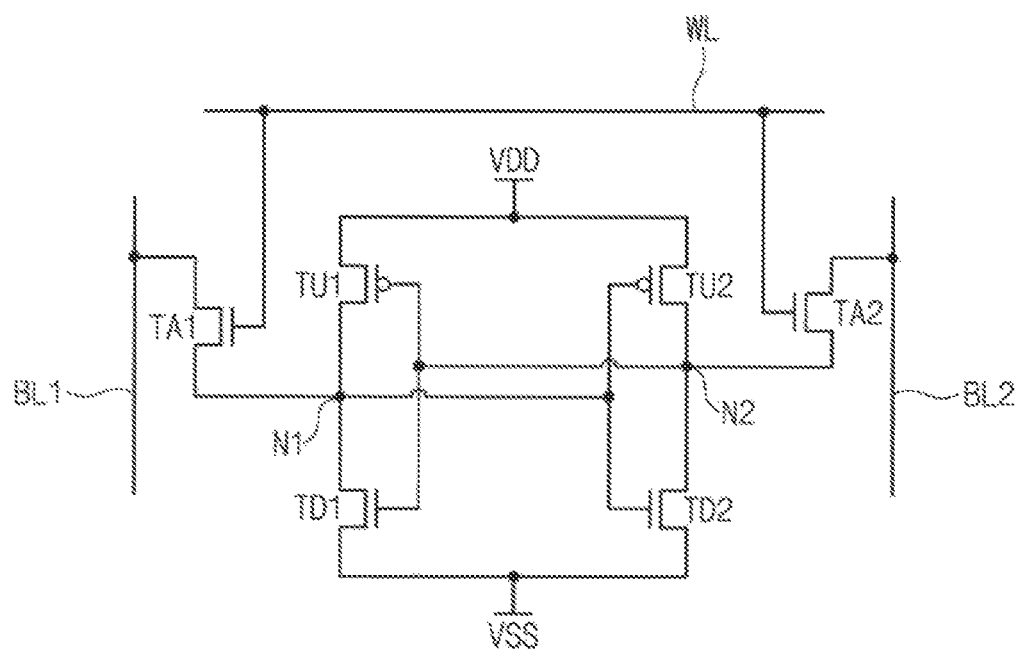
FIG. 1 is an equivalent circuit diagram of an SRAM cell according to an exemplary embodiment.

FIG. 1 is an equivalent circuit diagram of an SRAM cell according to various exemplary embodiments.

Referring to FIG. 1, an SRAM cell according to exemplary embodiments may include a first pull-up transistor TU1, a first pull-down transistor TD1, a second pull-up transistor TU2, a second pull-down transistor TD2, a first access transistor TA1, and a second access transistor TA2. A PMOS transistor may be adopted as the first and second pull-up transistors TU1 and TU2. An NMOS transistor may be adopted as the first and second pull-down transistors TD1 and TD2, as well as the first and second access transistors TA1 and TA2.

The first pull-up and pull-down transistors TU1 and TD1 may each have a first source/drain connected to a first node N1. The first pull-up transistor TU1 may have a second source/drain connected to a power line VDD, and the first pull-down transistor TD1 may have a second source/drain connected to a ground line VSS. The gates of first pull-up and pull-down transistors TU1 and TD1 may be electrically connected to each other. The first pull-up and pull-down transistors TU1 and TD1 may constitute a first inverter. The first inverter may have an input terminal corresponding to the connected gates of the first pull-up and pull-down transistors TU1 and TD1 and have an output terminal corresponding to the first node N1.

The second pull-up and pull-down transistors TU2 and TD2 may each have a first source/drain connected to a second node N2. The second pull-up transistor TU2 may have a second source/drain connected to the power line VDD, and the second pull-down transistor TD2 may have a second source/drain connected to the ground line VSS. The gates of second pull-up and pull-down transistors TU2 and TD2 may be electrically connected to each other. The second pull-up and pull-down transistors TU2 and TD2 may constitute a second inverter. The second inverter may have an input terminal corresponding to the connected gates of the second pull-up and pull-down transistors TU2 and TD2 and have an output terminal corresponding to the second node N2.

The first and second inverters may be connected to each other to constitute a latch structure. In this configuration, the gates of the first pull-up and pull-down transistors TU1 and TD1 may be electrically connected to the second node N2, and the gates of the second pull-up and pull-down transistors TU2 and TD2 may be electrically connected to the first node N1. The first access transistor TA1 may have a first source/drain connected to the first node N1 and have a second source/drain connected to a first bit line BL1. The second access transistor TA2 may have a first source/drain connected to the second node N2 and have a second source/drain connected to a second bit line BL2. The gates of first and second access transistors TA1 and TA2 may be electrically connected to a word line WL.

Figure 2:
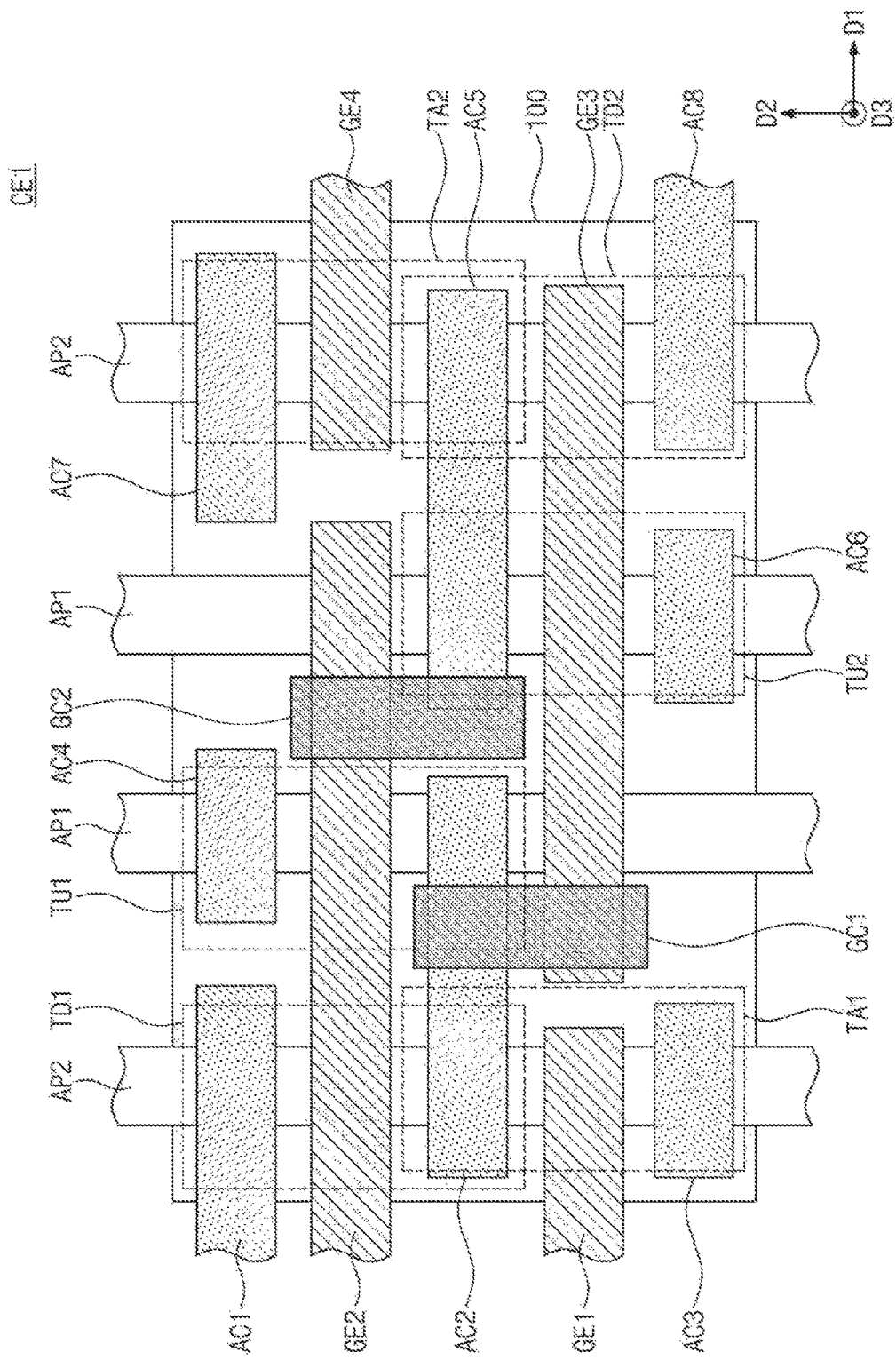
FIG. 2 is a plan view illustrating a first bit cell corresponding to the circuit diagram of FIG. 1.

FIG. 2 is a plan view illustrating a first bit cell obtained based on the circuit diagram of FIG. 1 for explaining a semiconductor device according to one or more exemplary embodiments.

Referring to FIGS. 1 and 2, a substrate 100 may have a first bit cell CE1 provided thereon for storing a single bit of data. The first bit cell CE1 may include a plurality of memory cell transistors that constitute an SRAM cell. The memory cell transistors may include the first pull-up transistor TU1, the first pull-down transistor TD1, the second pull-up transistor TU2, the second pull-down transistor TD2, the first access transistor TA1, and the second access transistor TA2 that are discussed above with reference to FIG. 1.

Although not shown, the memory cell transistors may be provided with a wiring layer including a word line, a first bit line, a second bit line, a ground line, and a power line. For example, the wiring layer may be composed of at least two or more layers.

The substrate 100 may have first and second active patterns AP1 and AP2 extending in a second direction D2 provided thereon. The first active patterns AP1 may be PMOS active patterns, and the second active patterns AP2 may be NMOS active patterns. For example, the first and second active patterns AP1 and AP2 may be portions of the substrate 100 that protrude from a top surface of the substrate 100, and may have a fin shape. The first and second active patterns AP1 and AP2 may be arranged along a first direction D1.

First to fourth gate electrodes GE1 to GE4 may be provided to extend in the first direction D1, while running across the first and second active patterns AP1 and AP2. The first and third gate electrodes GE1 and GE3 may be arranged along the first direction D1. The second and fourth gate electrodes GE2 and GE4 may be arranged along the first direction D1.

The first gate electrode GE1 may be a gate of the first access transistor TA1. Although not shown, the first gate electrode GE1 may be electrically connected to the word line in the wiring layer. The second gate electrode GE2 may be a common gate of the first pull-up and pull-down transistors TU1 and TD1. The third gate electrode GE3 may be a common gate of the second pull-up and pull-down transistors TU2 and TD2. The fourth gate electrode GE4 may be a gate of the second access transistor TA2. Although not shown, the fourth gate electrode GE4 may be electrically connected to the word line in the wiring layer.

The first to fourth gate electrodes GE1 to GE4 may be provided on their opposite sides with active contacts AC1 to AC8. The active contacts AC1 to AC8 may be electrically coupled to source/drains of the first and second active patterns AP1 and AP2. The active contacts AC1 to AC8 may include first to eighth active contacts AC1 to AC8. The first to eighth active contacts AC1 to AC8 may extend along the first direction D1.

The first active contact AC1 may be electrically connected to the second source/drain of the first pull-down transistor TD1. Although not shown, the first active contact AC1 may be electrically connected to the ground line in the wiring layer.

The first source/drains of the first pull-down and access transistors TD1 and TA1 may act as a common source/drain electrically connected to the second active contact AC2. The second active contact AC2 may extend in the first direction D1 and be electrically connected to the first source/drain of the first pull-up transistor TU1. The second contact AC2 may correspond to the first node N1 of FIG. 1.

The third active contact AC3 may be electrically connected to the second source/drain of the first access transistor TA1. Although not shown, the third active contact AC3 may be electrically connected to the first bit line in the wiring layer.

The fourth active contact AC4 may be electrically connected to the second source/drain of the first pull-up transistor TU1. Although not shown, the fourth active contact AC4 may be electrically connected to the power line in the wiring layer.

The fifth active contact AC5 may be electrically connected to the first source/drain of the second pull-up transistor TU2. The fifth active contact AC5 may extend in the first direction D1, and the first source/drains of the second pull-down and access transistors TD2 and TA2 may act as a common source/drain electrically connected to the fifth active contact AC5. The fifth active contact AC5 may correspond to the second node N2 of FIG. 1.

The sixth active contact AC6 may be electrically connected to the second source/drain of the second pull-up transistor TU2. Although not shown, the sixth active contact AC6 may be electrically connected to the power line in the wiring layer.

The seventh active contact AC7 may be electrically connected to the second source/drain of the second access transistor TA2. Although not shown, the seventh active contact AC7 may be electrically connected to the second bit line in the wiring layer.

The eighth active contact AC8 may be electrically connected to the second source/drain of the second pull-down transistor TD2. Although not shown, the eighth active contact AC8 may be electrically connected to the ground line in the wiring layer.

A first gate contact GC1 may be provided to electrically connect the second active contact AC2 to the third gate electrode GE3. The first gate contact GC1 may electrically connect the first node N1 of FIG. 1 to the common gate of the second pull-up and pull-down transistors TU2 and TD2.

A second gate contact GC2 may be provided to electrically connect the fifth active contact AC5 to the second gate electrode GE2. The second gate contact GC2 may electrically connect the second node N2 of FIG. 1 to the common gate of the first pull-up and pull-down transistors TU1 and TD1.

For example, the first gate contact GC1 and the second active contact AC2 may be integrally combined to constitute a single conductive structure. The second gate contact GC2 and the fifth active contact AC5 may be integrally combined to constitute a single conductive structure.

Figure 3:
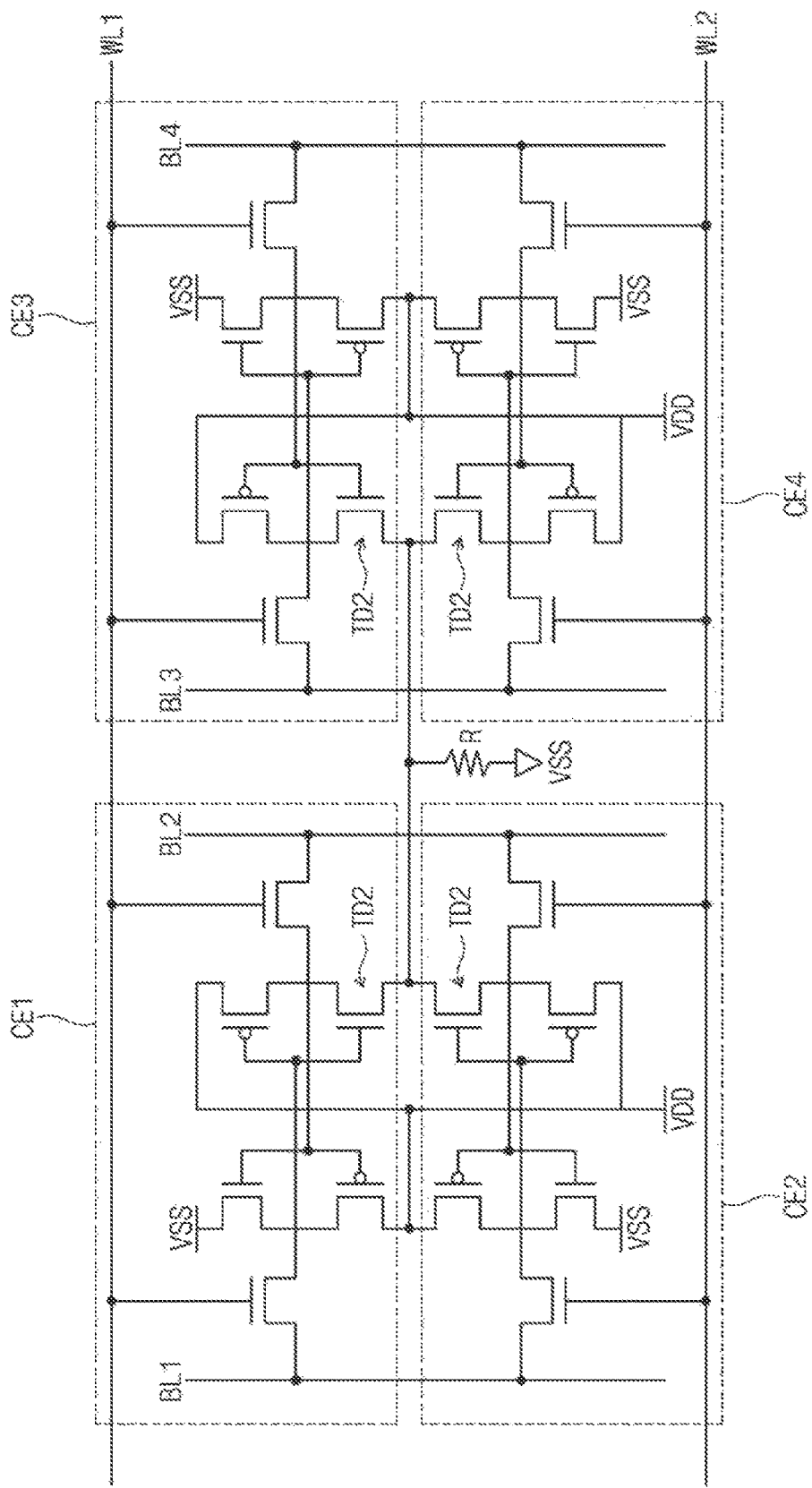
FIG. 3 is an equivalent circuit diagram of 2×2 SRAM cells according to one or more exemplary embodiments.
Figure 4:
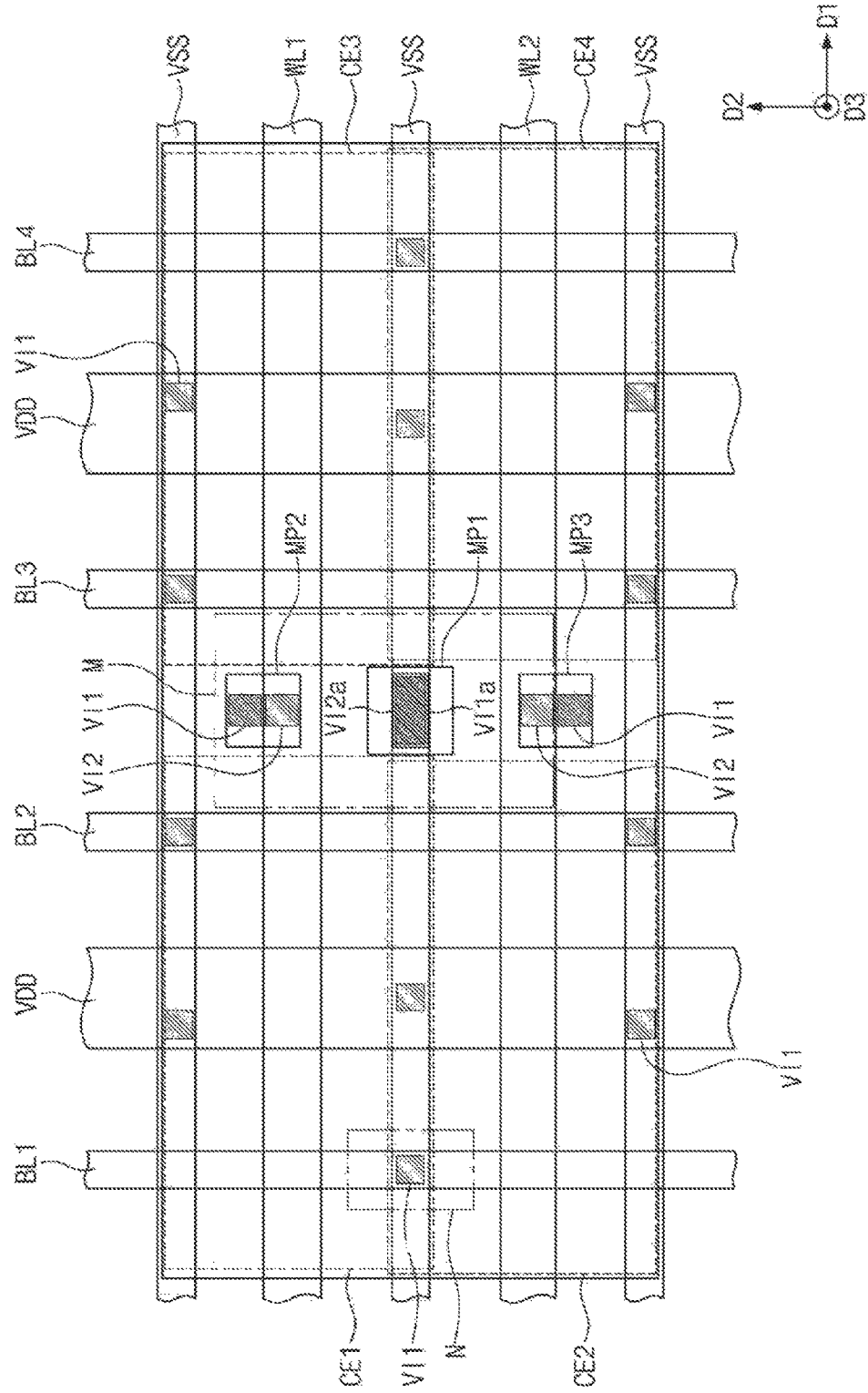
FIG. 4 is a plan view illustrating wiring lines on 2×2 SRAM cells corresponding to the circuit diagram of FIG. 3 according to one or more exemplary embodiments.
Figure 5:
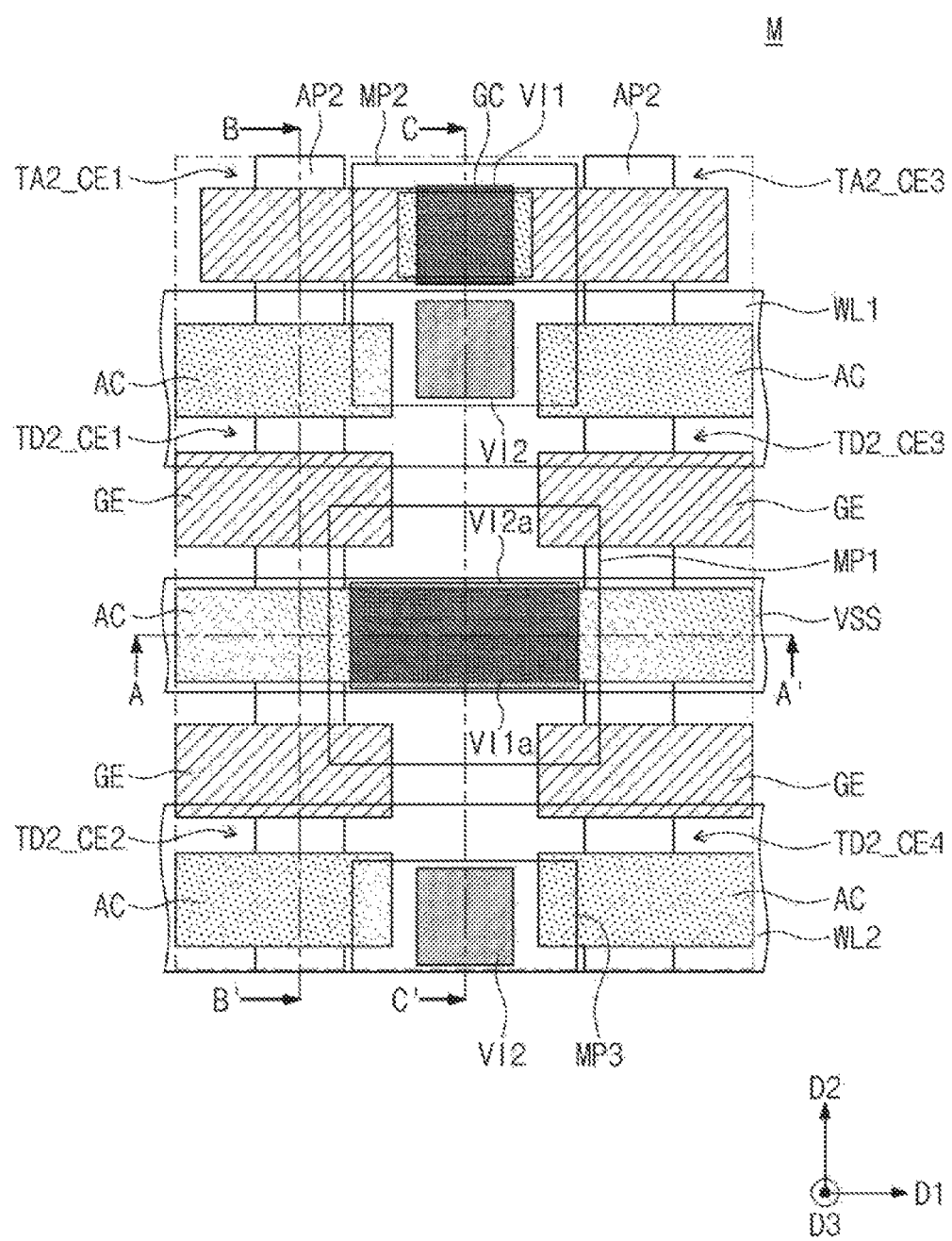
FIG. 5 is an enlarged plan view of section M shown in FIG. 4.
Figure 6A:
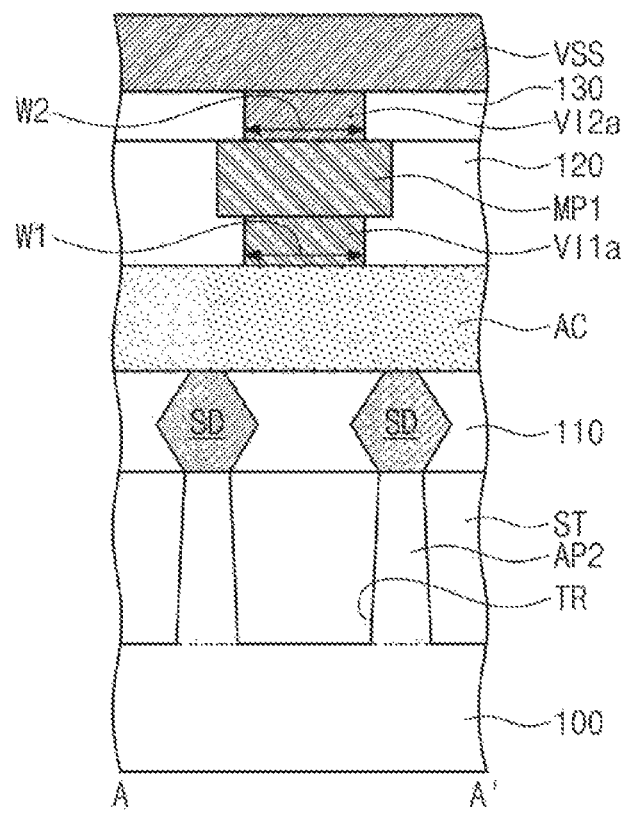
FIGS. 6A, 6B, and 6C are cross-sectional views respectively taken along lines A-A', B-B', and C-C' of FIG. 5.
Figure 6B:
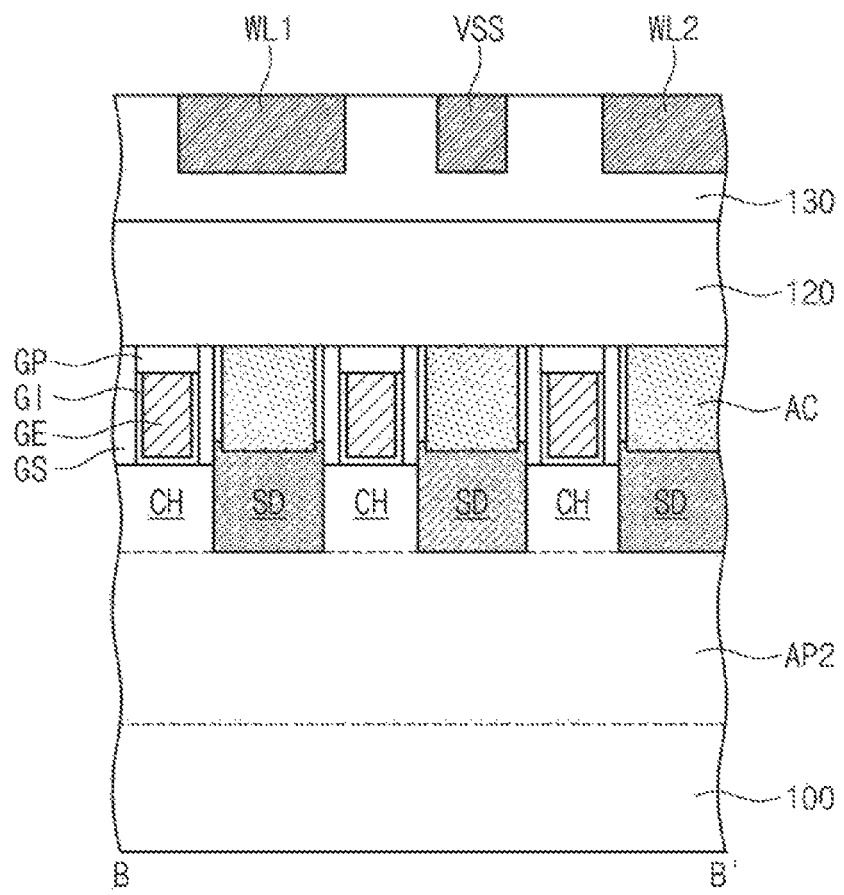
Figure 6C:
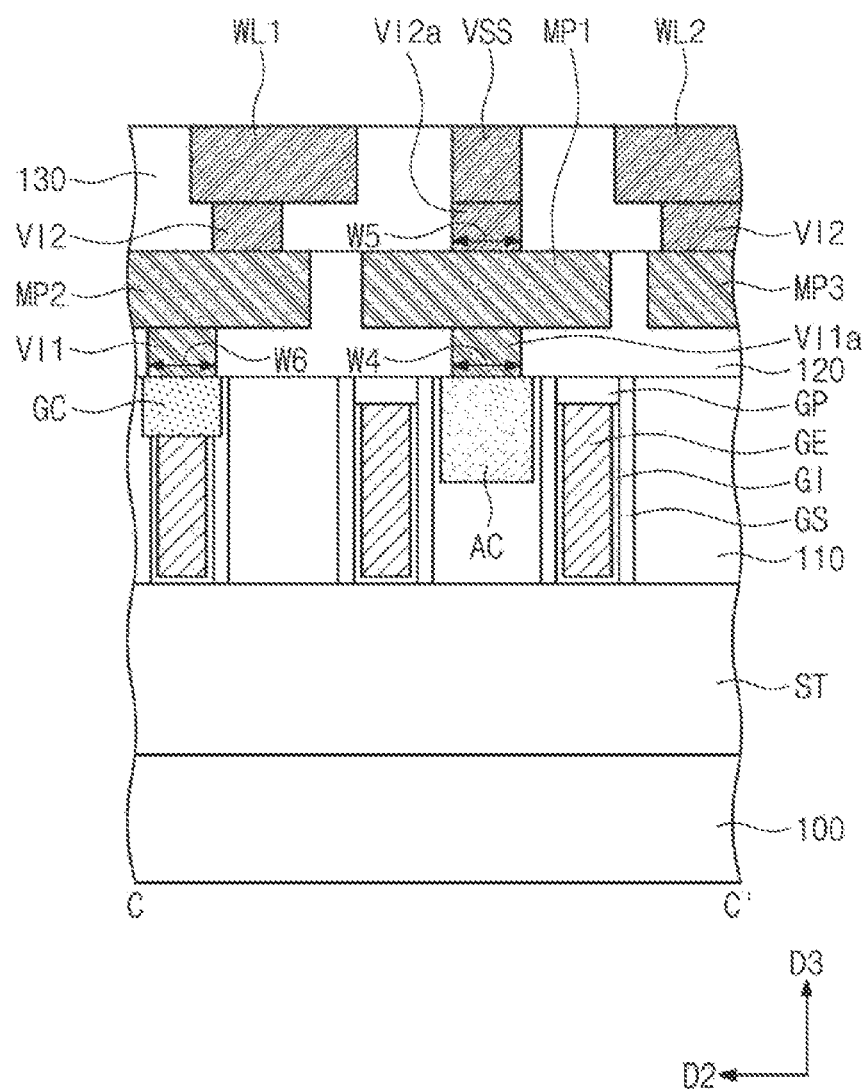
Figure 7:
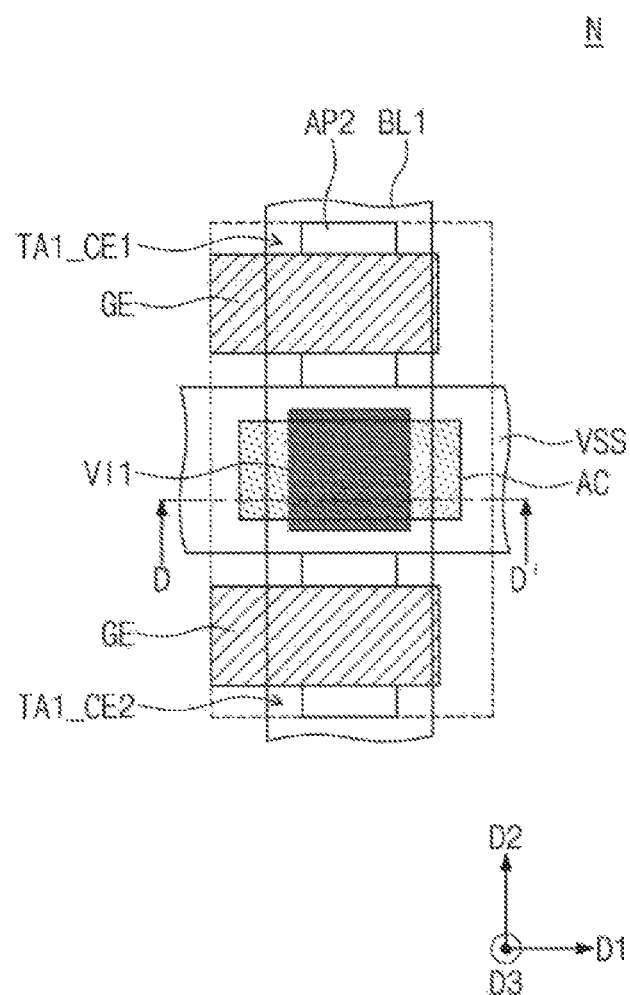
FIG. 7 is an enlarged plan view of section N shown in FIG. 4.
Figure 8:
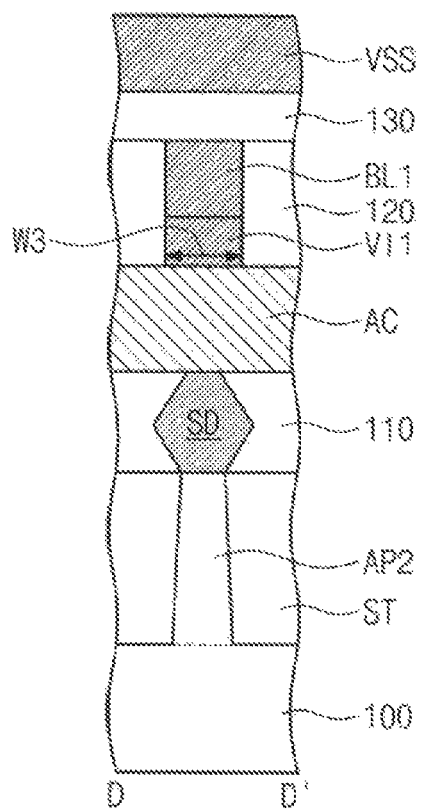
FIG. 8 is a cross-sectional view taken along line D-D' of FIG. 7.
Figure 9:
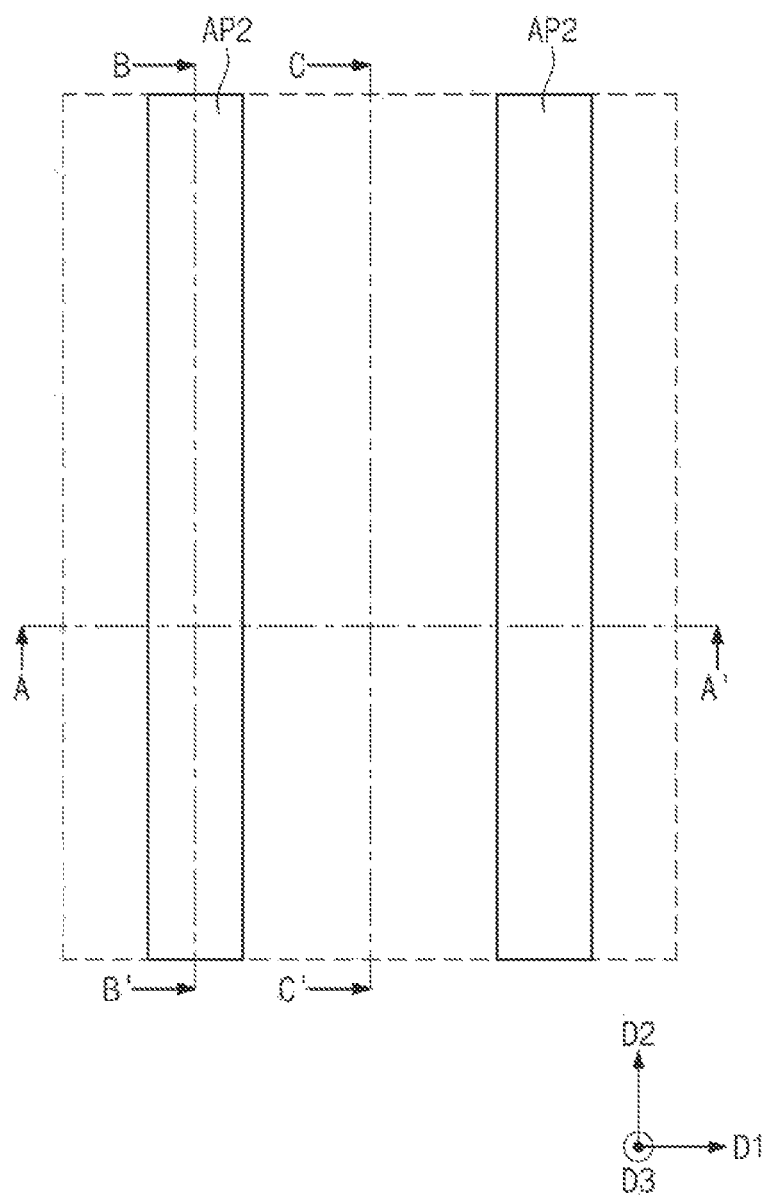
FIGS. 9, 11, 13, and 15 are plan views for explaining a method of manufacturing a semiconductor device according to one or more exemplary embodiments.
Figure 10A:
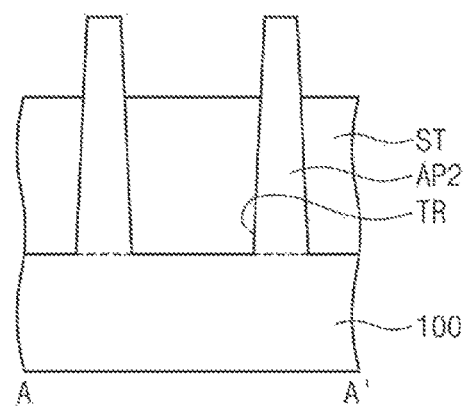
FIGS. 10A, 12A, 14A, and 16A are cross-sectional views taken along line A-A' of FIGS. 9, 11, 13, and 15, respectively.
Figure 10A:
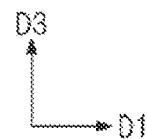
Figure 10B:
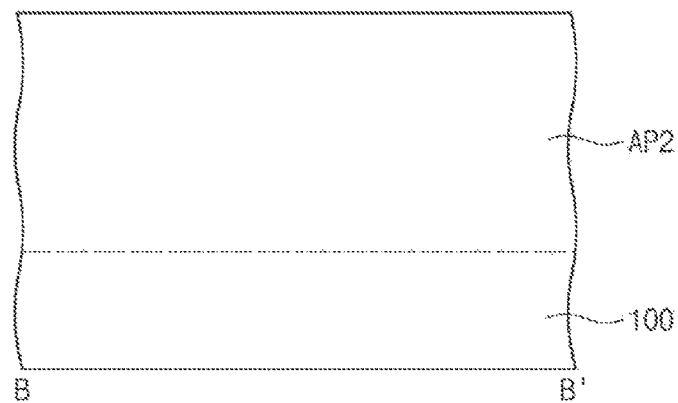
FIGS. 10B, 12B, 14B, and 16B are cross-sectional views taken along line B-B' of FIGS. 9, 11, 13, and 15, respectively.
Figure 10B:
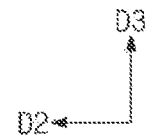
Figure 10C:
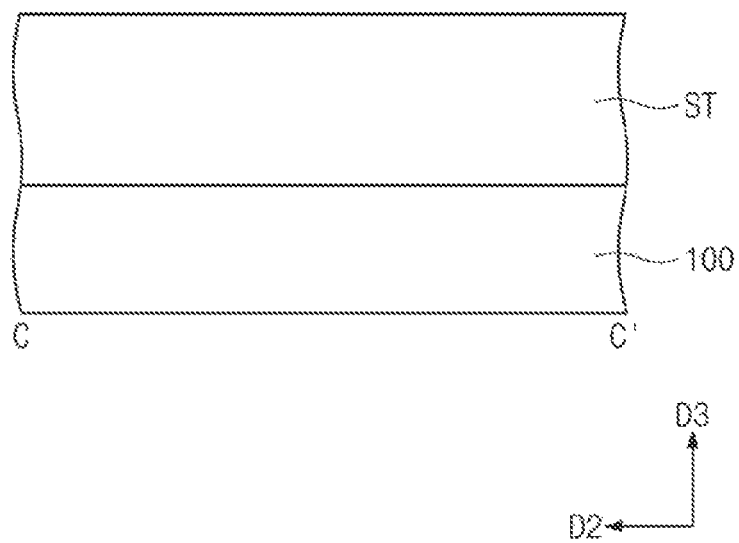
FIGS. 10C, 12C, 14C, and 16C are cross-sectional views taken along line C-C' of FIGS. 9, 11, 13, and 15, respectively.
Figure 11:
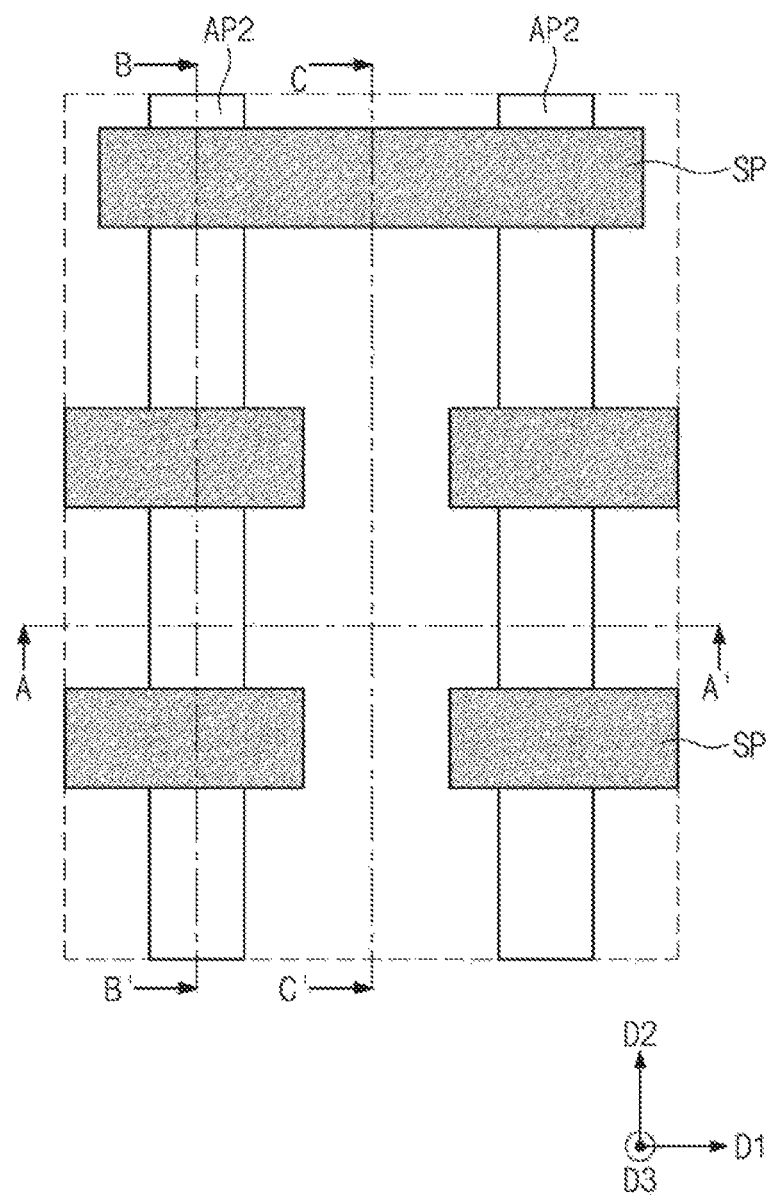
Figure 12A:
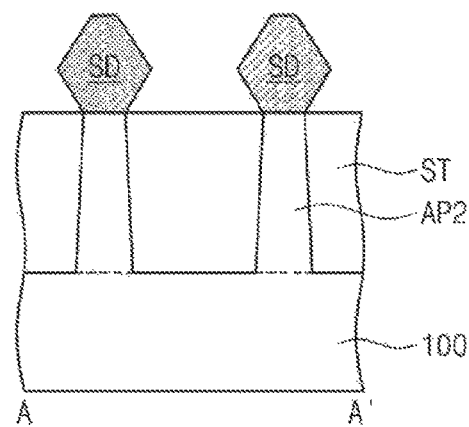
Figure 12B:
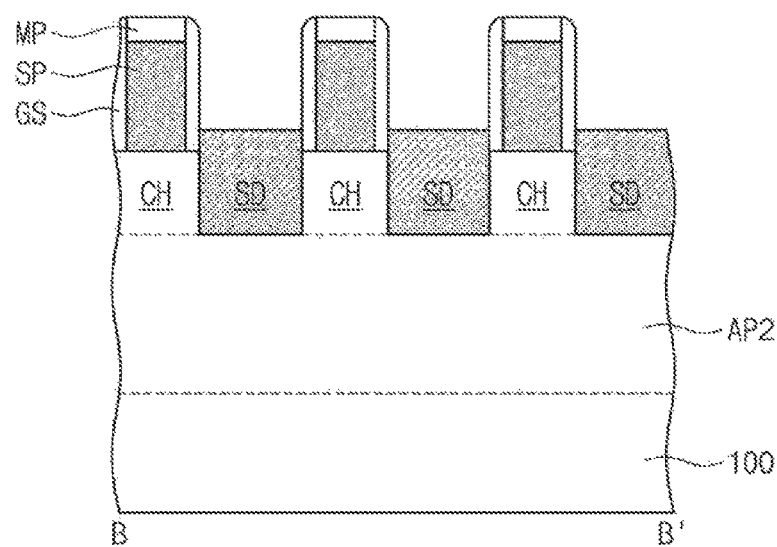
Figure 12C:
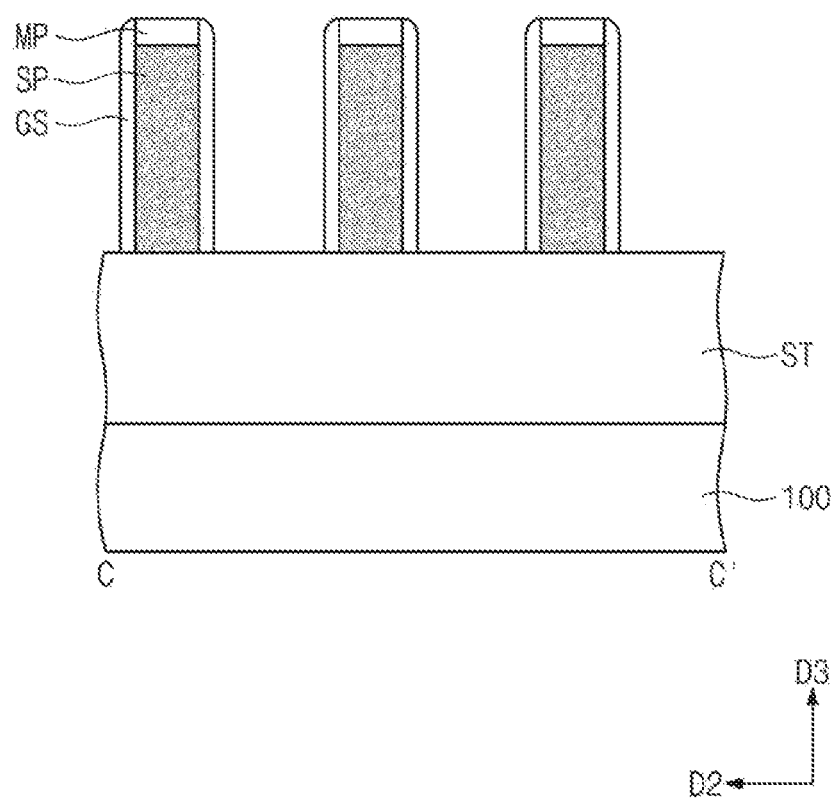
Figure 13:
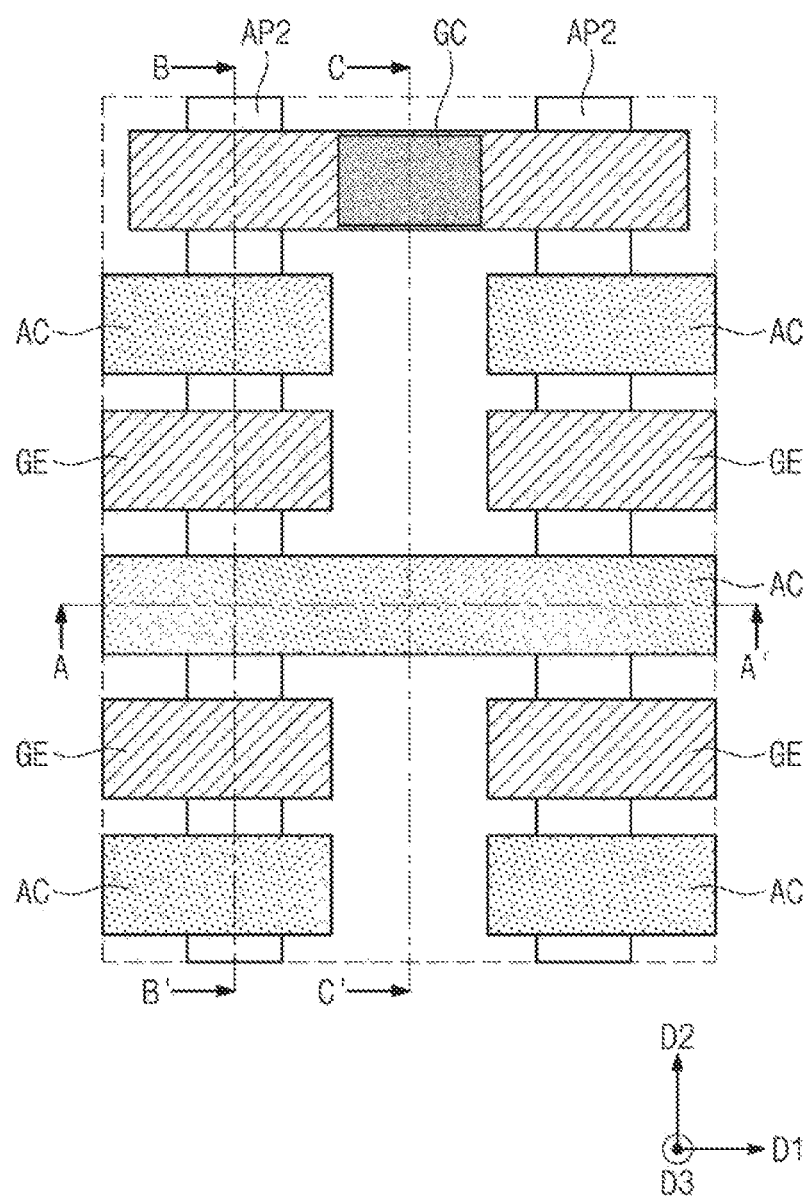
Figure 14A:
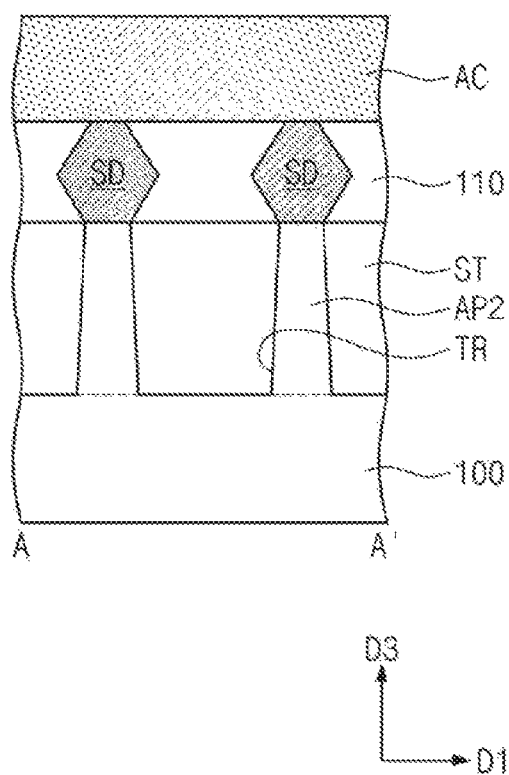
Figure 14B:
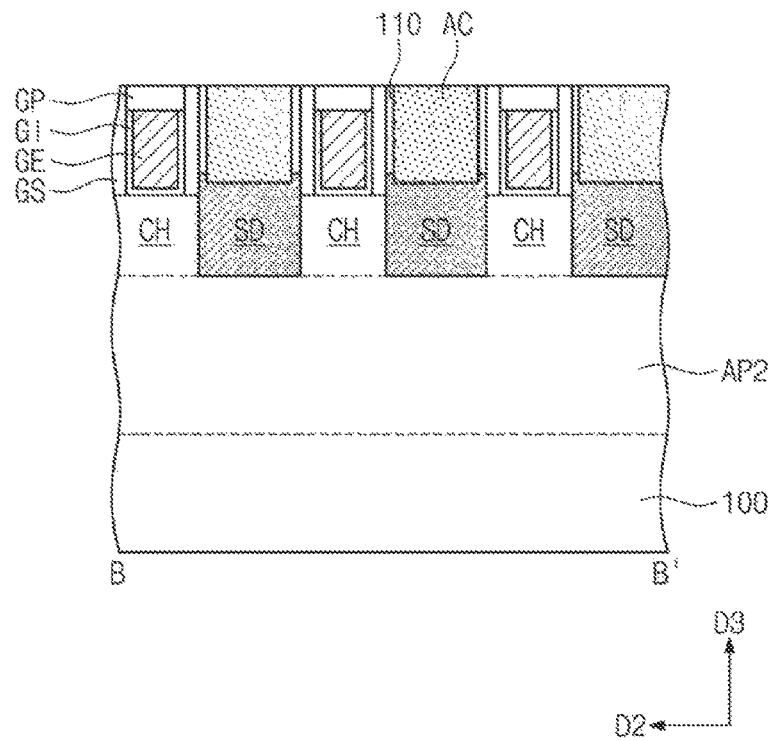
Figure 14C:
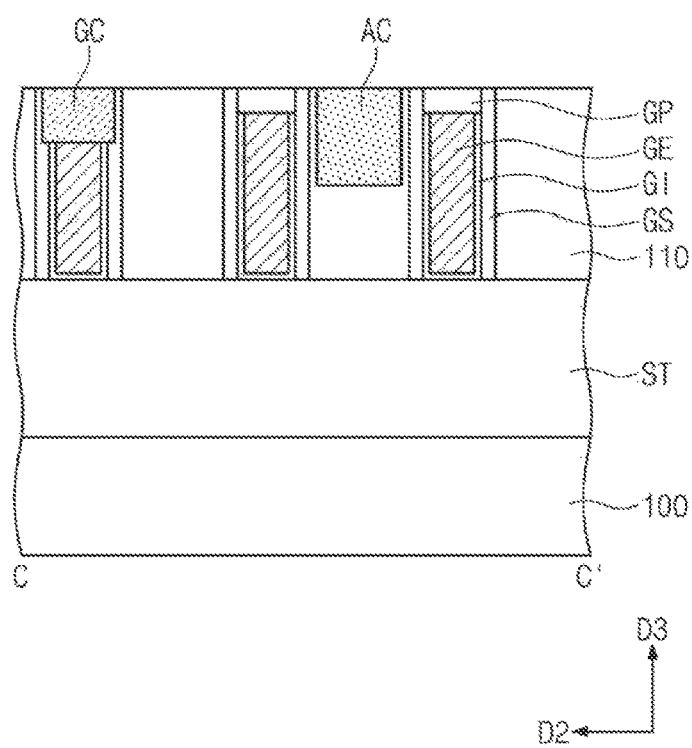
Figure 15:
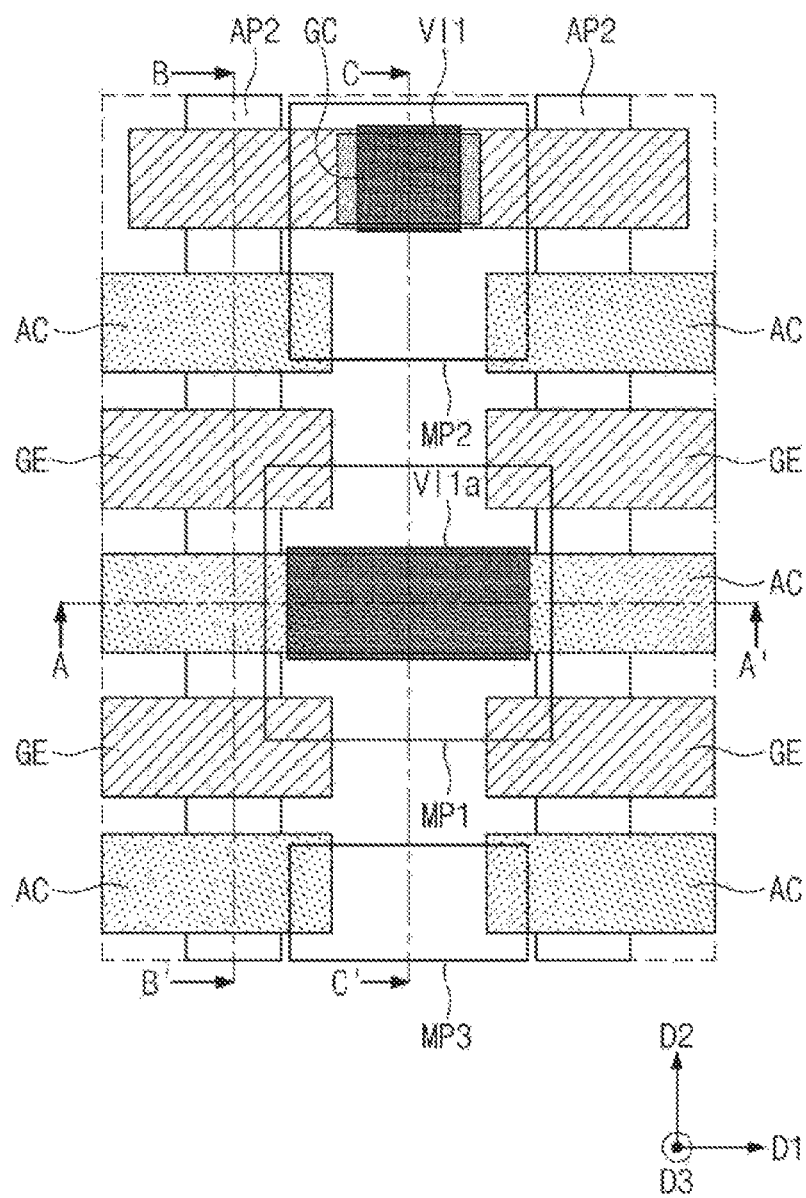
Figure 16A:
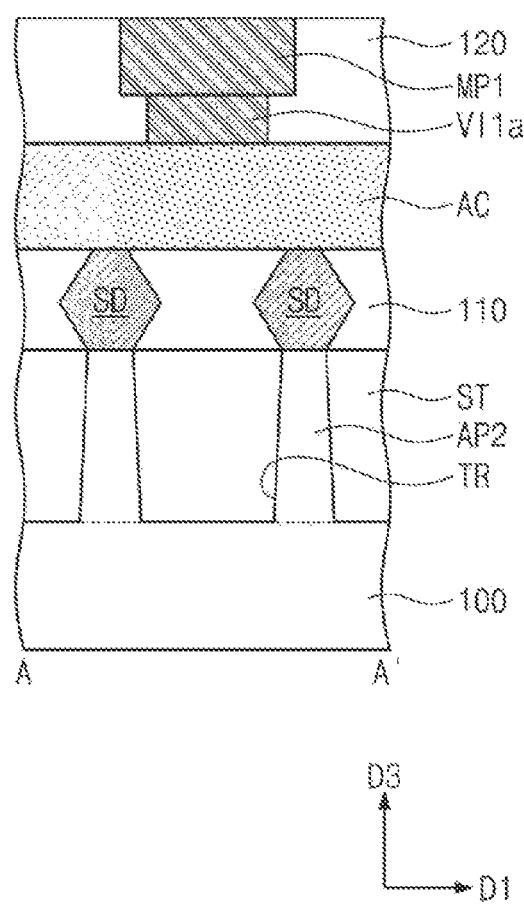
Figure 16B:
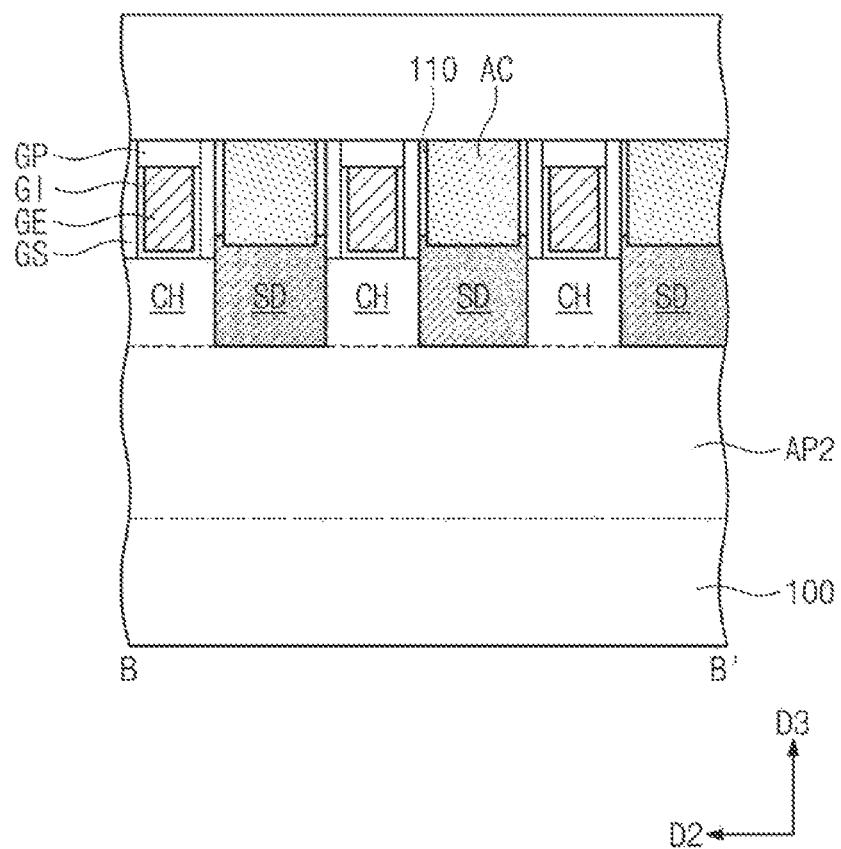
Figure 16C:
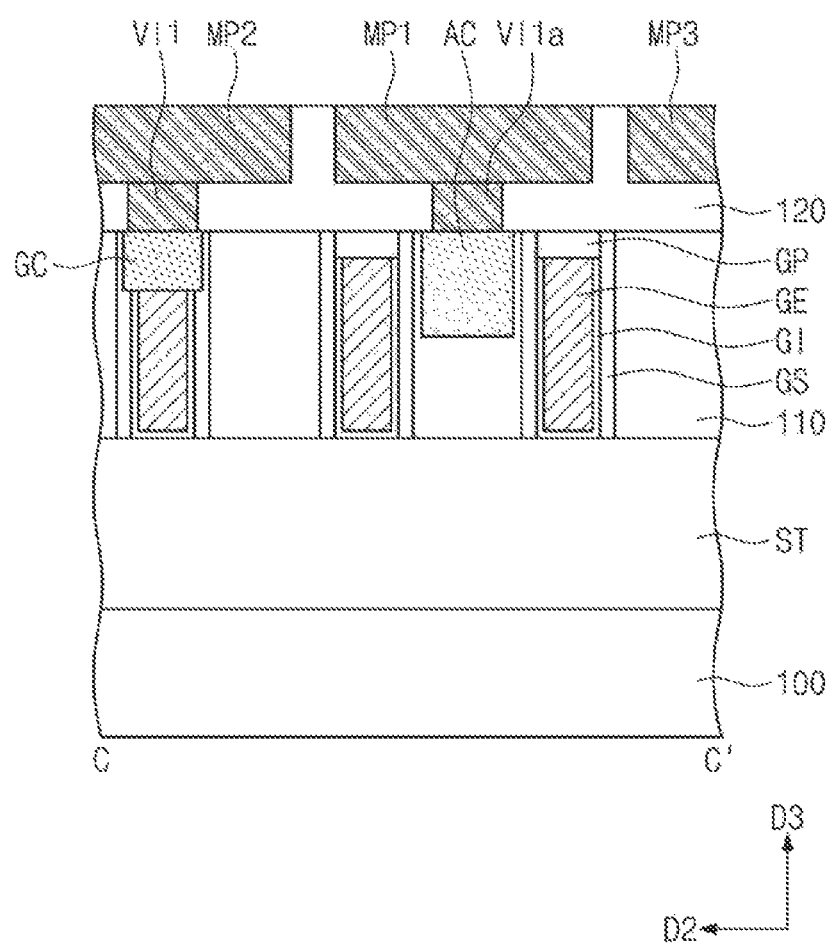

FIG. 3 is an equivalent circuit diagram of 2×2 SRAM cells according to one or more exemplary embodiments. FIG. 4 is a plan view illustrating wiring lines on 2×2 SRAM cells obtained based on the circuit diagram of FIG. 3 for explaining a semiconductor device according to one or more exemplary embodiments. FIG. 5 is an enlarged plan view of section M shown in FIG. 4. FIGS. 6A, 6B, and 6C are cross-sectional views respectively taken along lines A-A', B-B', and C-C' of FIG. 5. FIG. 7 is an enlarged plan view of section N shown in FIG. 4. FIG. 8 is a cross-sectional view taken along line D-D' of FIG. 7. In the description that follows, a detailed description of technical features repetitive to those formerly discussed with reference to FIGS. 1 and 2 will be omitted, and differences will be discussed in detail.

Referring to FIGS. 3 and 4, a substrate 100 may have 2×2 SRAM cells including first to fourth bit cells CE1 to CE4 provided thereon. FIG. 4 shows wiring layers of the first to fourth bit cells CE1 to CE4 according to one or more exemplary embodiments, but does not show detailed configurations of the memory cell transistors discussed above with reference to FIG. 2. For example, memory cell transistors of the first bit cell CE1 may be the same as those discussed above with reference to FIG. 2. In addition, memory cell transistors of each of the second to fourth bit cells CE2 to CE4 may have structures symmetric to those discussed above with reference to FIG. 2.

First and second wiring layers may be provided on the substrate 100. The second wiring layer may be disposed on the first wiring layer. The first wiring layer may include power lines VDD and first to fourth bit lines BL1 to BL4 extending in parallel to each other in a second direction D2. The first wiring layer may further include first, second, and third conductive patterns MP1, MP2, and MP3 that are disposed between the second and third bit lines BL2 and BL3. The first to third conductive patterns MP1 to MP3 may be arranged along the second direction D2. The second wiring layer may include ground lines VSS and first and second word lines WL1 and WL2 extending in parallel to each other in a first direction D1.

The first conductive pattern MP1 may be disposed beneath at least one ground line VSS. The second conductive pattern MP2 may be disposed beneath the first word line WL1, and the third conductive pattern MP3 may be disposed beneath the second word line WL2.

First vias VI1 and VI1a may be provided beneath the first wiring layer. The first vias VI1 and VI1a may electrically connect the bit lines BL1 to BL4, power line VDD and conductive patterns MP1 to MP3 of the first wiring layer to the memory cell transistors of the first to fourth bit cells CE1 to CE4. The first vias VI1 and VI1a may include at least one first extended via VI1a. The first extended via VI1a may be disposed beneath the first conductive pattern MP1. The first extended via VI1a may have a width in the first direction D1 greater than those of other first vias VI1.

For example, as shown in FIGS. 7 and 8, at least one of the first vias VI1 may electrically connect the first bit line BL1 to the second source/drain of the first access transistor TA1. At least another of the first vias VI1 may electrically connect the second bit line BL2 to the second source/drain of the second access transistor TA2. The first vias VI1 may electrically connect the power line VDD to the second source/drains of the first and second pull-up transistors TU1 and TU2.

Second vias VI2 and VI2a may be provided beneath the second wiring layer. The second vias VI2 and VI2a may be interposed between the first and second wiring layers. The second vias VI2 and VI2a may electrically connect the word lines WL1 and WL2, and ground line VSS of the second wiring layer to the first to third conductive patterns MP1 to MP3 of the first wiring layer.

The second vias VI2 and VI2a may include at least one second extended via VI2a. The second extended via VI2a may be disposed beneath the ground line VSS. The second extended via VI2a may have a width in the first direction D1 greater than those of other second vias VI2.

For example, as illustrated in FIGS. 5 and 6A-6C, the second extended via VI2a may electrically connect the ground line VSS to the second source/drain of the second pull-down transistor TD2. The ground line VSS may be electrically connected to the second source/drain of the second pull-down transistor TD2 through the second extended via VI2a, the first conductive pattern MP1, the first extended via VI1a, and an active contact AC.

The active contact AC beneath the first extended via VI1a may be connected in common to the second source/drains of the second pull-down transistors TD2 included in the first to fourth bit cells CE1 to CE4. Consequently, the ground line VSS on the second extended via VI2a may be connected in common to the second source/drains of the second pull-down transistors TD2 included in the first to fourth bit cells CE1 to CE4.

For example, as illustrated in FIGS. 5 and 6A to 6C, at least one of the second vias VI2 may electrically connect the first word line WL1 to the gate electrode of the second access transistor TA2. The first word line WL1 may be electrically connected to the gate electrode of the second access transistor TA2 through the second via VI2, the second conductive pattern MP2, the first via VI1, and a gate contact GC.

A semiconductor device according to one or more exemplary embodiments is structurally described hereinafter in more detail with reference to FIGS. 3, 4, 5, 6A to 6C, 7, and 8.

Device isolation layers ST may be provided at or on an upper portion of a substrate 100. The device isolation layers ST may define first and second active patterns AP1 and AP2. The substrate 100 may be a compound semiconductor substrate or a semiconductor substrate including silicon, germanium, silicon-germanium, etc. The device isolation layers ST may include an insulating material such as a silicon oxide layer.

The first and second active patterns AP1 and AP2 may be portions of the substrate 100 that protrude from a top surface of the substrate 100. A trench TR may be defined between neighboring first and second active patterns AP1 and AP2. The device isolation layer ST may fill the trench TR. The first and second active patterns AP1 and AP2 may have their upper portions that vertically protrude above the device isolation layers ST. Each upper portion of the first and second active patterns AP1 and AP2 may be shaped like a fin protruding between the device isolation layers ST.

Channels CH and source/drain patterns SD may be provided at or on each of the upper portion of the first and second active patterns AP1 and AP2. The source/drain patterns SD of the first active patterns AP1 may be p-type impurity regions. The source/drain patterns SD of the second active patterns AP2 may be n-type impurity regions. Each of the channels CH may be interposed between a pair of the source/drain patterns SD.

The source/drain patterns SD may be epitaxial patterns formed by a selective epitaxial growth process. The source/drain patterns SD may have top surfaces positioned higher than those of the channels CH. The source/drain patterns SD may include a semiconductor element the same as or different from that of the substrate 100. For example, the source/drain patterns SD of the first active patterns AP1 may include a semiconductor element whose lattice constant is greater than that of a semiconductor element included in the substrate 100. As a result, the source/drain patterns SD of the first active patterns AP1 may provide the channels CH with a compressive stress. For example, the source/drain patterns SD of the second active patterns AP2 may include a semiconductor element whose lattice constant is equal to or smaller than that of a semiconductor element included in the substrate 100. As a result, the source/drain patterns SD of the second active patterns AP2 may provide the channels CH with a tensile stress.

Gate electrodes GE may be provided to extend in a first direction D1, while running across the first and second active patterns AP1 and AP2. The gate electrode GE shown in FIGS. 5 and 6A to 6C may be the third gate electrode GE3 discussed above with reference to FIG. 2. The gate electrode GE shown in FIGS. 7 and 8 may be the first gate electrode GE1 discussed above with reference to FIG. 2.

The gate electrodes GE may vertically overlap the channels CH. Each of the gate electrodes GE may surround a top surface and opposite sidewalls of a corresponding one of the channels CH. For example, the gate electrodes GE may include one or more of conductive metal nitride (e.g., titanium nitride or tantalum nitride) and metal (e.g., titanium, tantalum, tungsten, copper, or aluminum).

A pair of gate spacers GS may be disposed on opposite sidewalls of each gate electrode GE. The gate spacers GS may extend in the first direction D1 along the gate electrodes GE. The gate spacers GS may have top surfaces higher than those of the gate electrodes GE. The top surfaces of the gate spacers GS may be coplanar with that of a first interlayer dielectric layer 110 which will be discussed below. The gate spacers GS may include one or more of $SiO_2$, SiCN, SiCON, and SiN. Alternatively, the gate spacers GS may include a multiple layer consisting of two or more of $SiO_2$, SiCN, SiCON, and SiN.

Gate dielectric patterns GI may be interposed between the gate electrodes GE and the first active patterns AP1 and between the gate electrodes GE and the second active patterns AP2. Each of the gate dielectric patterns GI may extend along a bottom surface of a corresponding one of the gate electrodes GE. Each of the gate dielectric patterns GI may cover the top surface and the opposite sidewalls of a corresponding one of the channels CH. The gate dielectric patterns GI may include a high-k dielectric material. For example, the high-k dielectric material may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

A gate capping pattern GP may be provided on each of the gate electrodes GE. The gate capping pattern GP may extend in the first direction D1 along the gate electrode GE. The gate capping pattern GP may be interposed between a pair of the gate spacers GS. The gate capping patterns GP may include a material having an etch selectivity to first, second, and third interlayer dielectric layers 110, 120, and 130 which will be discussed below. In detail, the gate capping patterns GP may include one or more of SiON, SiCN, SiCON, and SiN.

A first interlayer dielectric layer 110 may be provided on the substrate 100. The first interlayer dielectric layer 110 may cover the gate spacers GS and the source/drain patterns SD. The first interlayer dielectric layer 110 may have a top surface substantially coplanar with those of the gate capping patterns GP and those of the gate spacers GS.

Active contacts AC may be provided on opposite sides of each of the gate electrodes GE. The active contacts AC may penetrate an upper portion of the first interlayer dielectric layer 110 and be coupled to the source/drain patterns SD. The active contacts AC may have top surfaces coplanar with that of the first interlayer dielectric layer 110. For example, at least one of the active contacts AC may be connected to a plurality of the source/drain patterns SD. Alternatively, at least one of the active contacts AC may be connected to a single source/drain pattern SD. The active contacts AC may include one or more of conductive metal nitride (e.g., titanium nitride or tantalum nitride) and metal (e.g., titanium, tantalum, tungsten, copper, or aluminum).

A gate contact GC may be provided on at least one of the gate electrodes GE. The gate contact GC may penetrate an upper portion of the first interlayer dielectric layer 110, the gate spacers GS, and the gate capping pattern GP, and thus be coupled to at least one of the gate electrodes GE. The gate contact GC may have a top surface coplanar with that of the first interlayer dielectric layer 110. The gate contact GC may have a bottom surface positioned higher than those of the active contacts AC. The gate contact GC may include one or more of conductive metal nitride (e.g., titanium nitride or tantalum nitride) and metal (e.g., titanium, tantalum, tungsten, copper, or aluminum). The gate contact GC may include the same material as that of the active contact AC.

A second interlayer dielectric layer 120 may be provided on the first interlayer dielectric layer 110, and a third interlayer dielectric layer 130 may be provided on the second interlayer dielectric layer 120. For example, the first to third interlayer dielectric layers 110 to 130 may include a silicon oxide layer.

The second interlayer dielectric layer 120 may have a first wiring layer including first to fourth bit lines BL1 to BL4, power lines VDD, and first to third conductive patterns MP1 to MP3 provided therein. First vias VI1 and VI1a may be disposed in a lower portion of the second interlayer dielectric layer 120. The first vias VI1 and VI1a may be interposed between and electrically connect the contacts AC and GC and the bit lines BL1 to BL4, power line VDD, and conductive patterns MP1 to MP3 of the first wiring layer. For example, at least one of the first vias VI1 and VI1a and at least one of the bit lines BL1 to BL4, power line VDD, and conductive patterns MP1 to MP3 of the first wiring layer may be integrally combined to constitute a single conductive structure.

The third interlayer dielectric layer 130 may have a second wiring layer including first and second word lines WL1 and WL2 and ground lines VSS provided therein. Second vias VI2 and VI2a may be disposed in a lower portion of the third interlayer dielectric layer 130. The second vias VI2 and VI2a may be interposed between and electrically connect the word lines WL1 and WL2, and ground line VSS of the second wiring layer and the bit lines BL1 to BL4, power source VDD, and conductive patterns MP1 to MP3 of the first wiring layer. For example, at least one of the second vias VI2 and VI2a and at least one of the word lines WL1, WL2, and ground line VSS of the second wiring layer may be integrally combined to constitute a single conductive structure.

The bit lines BL1 to BL4, power source VDD, and conductive patterns MP1 to MP3 of the first wiring layer, the first vias VI1 and VI1a, the word lines WL1 and WL2, and ground line VSS of the second wiring layer, and the second vias VI2 and VI2a may include one or more of conductive metal nitride (e.g., titanium nitride or tantalum nitride) and metal (e.g., titanium, tantalum, tungsten, copper, or aluminum).

The first via VI1a (referred to hereinafter as a first extended via) may have a first width W1 in the first direction D1, and the second via VI2a (referred to hereinafter as a second extended via) may have a second width W2 in the first direction D1. The first via VI1 may have a third width W3 in the first direction D1. The first width W1 may be greater than the third width W3, and the second width W2 may be greater than the third width W3. The first and second widths W1 and W2 may be substantially the same. Although not shown, the second via VI2 may have a width in the first direction D1 substantially the same as the third width W3.

The first extended via VI1a may have a fourth width W4 in a second direction D2, and the second extended via VI2a may have a fifth width W5 in the second direction D2. The first via VI1 may have a sixth width W6 in the second direction D2. The fourth, fifth, and sixth widths W4, W5, and W6 may be substantially the same.

In a semiconductor device according to one or more exemplary embodiments, the ground line VSS may be connected in common through the first and second extended vias VI1a and VI2a to the second source/drains of the second pull-down transistors TD2 included in the first to fourth bit cells CE1 to CE4. Because the first and second extended vias VI1a and VI2a have relatively wide widths, an electrical resistance, for example R of FIG. 3, may be reduced between the ground line VSS and the second source/drains of the second pull-down transistors TD2.

Because the first and second vias VI1 and VI2 have relatively small sizes electrically connected to the bit lines BL1 to BL4 and the word lines WL1 and WL2, a parasitic capacitance may be reduced between the first and second vias VI2 and VI2 and the bit lines BL1 to BL4, and word lines WL1 and WL2.

FIGS. 9, 11, 13, and 15 are plan views for explaining a method of manufacturing a semiconductor device according to one or more exemplary embodiments. FIGS. 9, 11, 13, and 15 each correspond to section M of FIG. 4. FIGS. 10A, 12A, 14A, and 16A are cross-sectional views taken along line A-A' of FIGS. 9, 11, 13, and 15, respectively. FIGS. 10B, 12B, 14B, and 16B are cross-sectional views taken along line B-B' of FIGS. 9, 11, 13, and 15, respectively. FIGS. 10C, 12C, 14C, and 16C are cross-sectional views taken along line C-C' of FIGS. 9, 11, 13, and 15, respectively.

Referring to FIGS. 9 and 10A to 10C, a substrate 100 may be patterned to form active patterns AP2. In detail, the formation of the active patterns AP2 may include forming mask patterns on the substrate 100 and anisotropically etching the substrate 100 using the mask patterns as an etch mask. A trench TR may be formed between a pair of neighboring active patterns AP2. The substrate 100 may be a compound semiconductor substrate or a semiconductor substrate including silicon, germanium, silicon-germanium, etc.

Device isolation layers ST may be formed to fill the trenches TR. In detail, an insulation layer (e.g., a silicon oxide layer) may be formed to fill the trenches TR. Thereafter, the insulation layer may be recessed until exposing upper portions of the active patterns AP2.

Referring to FIGS. 11 and 12A to 12C, sacrificial patterns SP may be formed to run across the active patterns AP2. The sacrificial patterns SP may be formed to have a linear or bar shape extending in a first direction D1. In detail, the formation of the sacrificial patterns SP may include forming a sacrificial layer on an entire surface of the substrate 100, forming mask patterns MP on the sacrificial layer, and patterning the sacrificial layer using the mask patterns MP as an etch mask. The sacrificial layer may include a polysilicon layer.

A pair of gate spacers GS may be formed on opposite sidewalls of each of the sacrificial patterns SP. The formation of the gate spacers GS may include conformally forming a spacer layer on the entire surface of the substrate 100 and anisotropically etching the spacer layer. The spacer layer may include one or more of $SiO_2$, SiCN, SiCON, and SiN.

Alternatively, the spacer layer may include a multiple layer consisting of two or more of $SiO_2$, SiCN, SiCON, and SiN.

Source/drain patterns SD may be formed on opposite sides of each of the sacrificial patterns SP. The source/drain patterns SD may be formed by a selective epitaxial growth process that uses the substrate 100 as a seed layer. For example, the selective epitaxial growth process may include chemical vapor deposition (CVD) or molecular beam epitaxy (MBE).

First, a selective etching process may be performed on the active patterns AP on the opposite sides of each of the sacrificial patterns SP. Upper portions of the etched active patterns AP2 may be used as a seed layer to form the source/drain patterns SD. The formation of the source/drain patterns SD may define a channel CH between a pair of the source/drain patterns SD.

Referring to FIGS. 13 and 14A to 14C, a first interlayer dielectric layer 110 may be formed to cover the source/drain patterns SD, the sacrificial patterns SP, and the gate spacers GS. For example, the first interlayer dielectric layer 110 may include a silicon oxide layer. The first interlayer dielectric layer 110 may be planarized until exposing top surfaces of the sacrificial patterns SP. An etch-back or chemical mechanical polishing (CMP) process may be performed to planarize the first interlayer dielectric layer 110. As a result, the first interlayer dielectric layer 110 may have a top surface substantially coplanar with those of the sacrificial patterns SP and those of the gate spacers GS.

The sacrificial patterns SP may be replaced with gate electrodes GE. In detail, an anisotropic etching process may be performed on the exposed sacrificial patterns SP. The anisotropic etching process may selectively etch the sacrificial patterns SP.

Gate dielectric patterns GI and the gate electrode GE may be formed in empty spaces where the sacrificial patterns SP are removed. The gate dielectric pattern GI may be conformally formed to incompletely fill the empty space. The gate dielectric pattern GI may be formed by an atomic layer deposition (ALD) process or a chemical oxidation process. For example, the gate dielectric pattern GI may include a high-k dielectric material. The high-k dielectric material may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

The gate electrode GE may be obtained by forming on the gate dielectric pattern GI a gate electrode layer to completely fill the empty space and planarizing the gate electrode layer. For example, the gate electrode layer may include one or more of conductive metal nitride (e.g., titanium nitride or tantalum nitride) and metal (e.g., titanium, tantalum, tungsten, copper, or aluminum).

The gate electrodes GE may be recessed by selectively etching upper portions thereof. The recessed gate electrodes GE may have top surfaces lower than that of the first interlayer dielectric layer 110 and those of the gate spacers GS. Gate capping patterns GP may be formed on the recessed gate electrodes GE. The formation of the gate capping patterns GP may include forming a gate capping layer to cover the recessed gate electrodes GE and planarizing the gate capping layer until exposing the top surface of the first interlayer dielectric layer 110. For example, the gate capping layer may include one or more of SiON, SiCN, SiCON, and SiN.

Active contacts AC may be formed to penetrate the first interlayer dielectric layer 110 and coupled to the source/drain patterns SD. A gate contact GC may be formed to penetrate the first interlayer dielectric layer 110 and coupled to at least one gate electrode GE. The formation of the active contacts AC and the gate contact GG may include forming holes to define the active contacts AC and the gate contact GC and forming conductive layers to fill the holes. The conductive layer may include one or more metal nitride and metal.

Referring to FIGS. 15 and 16A to 16C, a second interlayer dielectric layer 120 may be formed on the first interlayer dielectric layer 110. A first wiring layer (e.g., first to third conductive pattern MP1, MP2, and MP3) and first vias VI1 and VI1a may be formed in the second interlayer dielectric layer 120. The first vias VI1 and VI1a may be interposed between and electrically connect the contacts AC and GC and the conductive patterns MP1, MP2, and MP3 of the first wiring layer.

The formation of the first wiring layer MP1 to MP3 and the first vias VI1 and VI1a may include patterning the second interlayer dielectric layer 120 to form holes defining the first wiring layer MP1 to MP3 and the first vias VI1 and VI1a and forming a conductive layer to fill the holes. The first wiring layer MP1 to MP3 and the first vias VI1 and VI1a may be formed using one or more of conductive metal nitride and metal.

For example, the first wiring layer MP1 to MP3 and the first vias VI1 and VI1a may be integrally formed. In other words, a dual damascene process may be employed to form the first wiring layer MP1 to MP3 and the first vias VI1 and VI1a in the second interlayer dielectric layer 120.

The first vias VI1 and VI1a may include a first extended via VI1a, which is formed to have a width in the first direction D1 greater than those of other first vias VI1. To put it another way, the hole defining the first extended via VI1a may be formed to have a size greater than those of the holes defining the first vias VI1.

Referring back to FIGS. 5 and 6A to 6C, a third interlayer dielectric layer 130 may be formed on the second interlayer dielectric layer 120. A second wiring layer (e.g., first and second word lines WL1 and WL2 and a ground line VSS) and second vias VI2 and VI2a may be formed in the third interlayer dielectric layer 130. The second vias VI2 and VI2a may be interposed between and electrically connect the word lines WL1 and WL2, and the ground line VSS of the second wiring layer and the conductive patterns MP1 to MP3 of the first wiring layer.

The formation of the second wiring layer WL1, WL2, and VSS and the second vias VI2 and VI2a may include patterning the third interlayer dielectric layer 130 to form holes defining the second wiring layer WL1, WL2, and VSS and the second vias VI2 and VI2a and forming a conductive layer to fill the holes. The second wiring layer WL1, WL2, and VSS and the second vias VI2 and VI2a may be formed using one or more of conductive metal nitride and metal.

For example, the second wiring layer WL1, WL2, and VSS and the second vias VI2 and VI2a may be integrally formed. In other words, a dual damascene process may be employed to form the second wiring layer WL1, WL2, and VSS and the second vias VI2 and VI2a in the third interlayer dielectric layer 130.

The second vias VI2 and VI2a may include a second extended via VI2a, which is formed to have a width in the first direction D1 greater than those of other second vias VI2. To put it another way, the hole defining the second extended via VI2a may be formed to have a size greater than those of the holes defining the second vias VI2.

Figure 17:
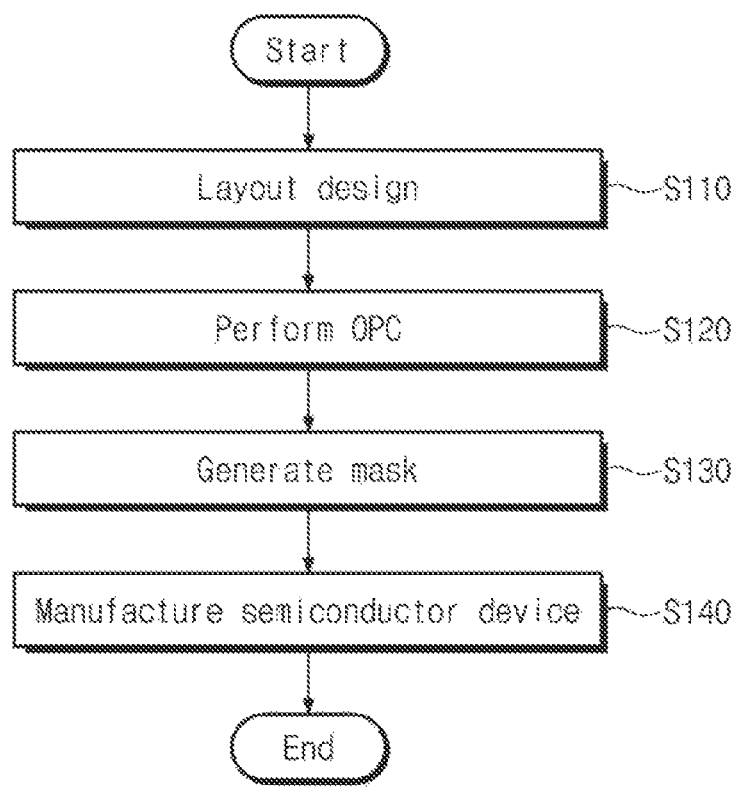
FIG. 17 is a flow chart illustrating a method of designing and manufacturing a semiconductor device according to one or more exemplary embodiments.

FIG. 17 is a flow chart illustrating a method of designing and manufacturing a semiconductor device according to one or more exemplary embodiments.

Referring to FIG. 17, a layout design process S110 may be performed to realize a semiconductor integrated circuit on a silicon substrate. The layout design process may include a routing step that places and connects various standard cells provided from a cell library, based on a design rule.

The cell library for the layout design process may contain information on operation, speed, and power consumption of the standard cell. Most layout design tools may be provided or defined with a cell library for representing a layout of a specific gate-level circuit. The layout design process may define shapes or dimensions of patterns constituting transistors and metal lines that will be actually formed on a silicon substrate. For example, in order to actually form an inverter circuit on a silicon substrate, it may be necessary to properly place or draw a layout of certain patterns such as PMOS, NMOS, N-WELL, gate electrodes, and metal lines thereon. For this, a search may be first performed to select a suitable predefined inverter in the cell library.

In addition, a routing step may be performed on the selected and placed standard cells. Specifically, a routing step may be performed to connect the selected and placed standard cells to their overlying lines. The standard cells may be designed to be connected to each other through the routing step. A series of these steps may be automatically or manually performed in the layout design tool. In certain exemplary embodiments, a step of placing and routing the standard cells may be automatically performed by an additional Place & Routing tool.

After the routing step, a verification step may be performed on the layout to check whether any portion of the schematic circuit violates the given design rule. In certain exemplary embodiments, the verification step may include a design rule check (DRC) for verifying whether the layout meets the given design rule, an electrical rule check (ERC) for verifying whether there is an issue of an electrical disconnection in the layout, and a layout vs. schematic (LVS) for verifying whether the layout is coincident with the gate-level netlist.

An optical proximity correction (OPC) process S120 may then be performed. A photolithography process may be employed to realize the layout patterns designed in the layout design process on a silicon substrate. The optical proximity correction process may be a technique for correcting occurrence of an unintended phenomenon in the photolithography process. That is, the optical proximity correction process may correct an undesirable phenomenon, such as refraction or process side effects caused by characteristics of light in an exposure process using the layout patterns. When the optical proximity correction process is performed, the designed layout patterns may be slightly changed (or biased) in their shapes and positions.

A photomask may be generated S130 based on the layout changed by the optical proximity correction process. The photomask may generally be manufactured by describing the layout patterns using a chromium layer coated on a glass substrate.

The manufactured photomask may be used to fabricate a semiconductor device S140. Various exposure and etching processes may be repeatedly performed in fabricating the semiconductor device using the photomask. Through these processes described above, patterns defined in the layout design process may be sequentially formed on a silicon substrate.

According to one or more exemplary embodiments, the first to fourth stages S110 to S140 may be adopted to form the first extended via VI1a discussed above with reference to FIGS. 15 and 16A to 16C and the second extended via VI2a discussed above with reference to FIGS. 5 and 6A to 6C.

Specifically, in the layout design process (S110), a layout pattern defining the first extended via VI1a may have a size greater than those of layout patterns defining the first vias VI1. Likewise, in the layout design process (S110), a layout pattern defining the second extended via VI2a may have a size greater than those of layout patterns defining the second vias VI2. Based on the layout patterns defined in the layout design process (S110), the first and second extended vias VI1a and VI2a may be achieved on a silicon substrate.

Figure 18:
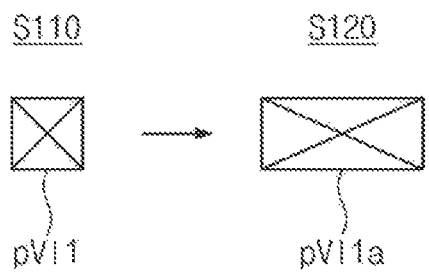
FIG. 18 is a conceptual diagram illustrating a bias procedure of a layout pattern by an optical proximity correction according to an exemplary embodiment.

According to one or more other exemplary embodiments, the first to fourth stages S110 to S140 may be adopted to form the first extended via VI1a and the second extended via VI2a through a method as below. FIG. 18 is a conceptual diagram illustrating a bias procedure of a layout pattern by an optical proximity correction. In detail, referring to FIG. 18, in the layout design process (S110), a layout pattern pVI1 may be placed to define the first extended via VI1a. In the layout design process S110, the layout pattern pVI1 for the first extended via VI1a may have the same size as that of a layout pattern for the first via VI1.

In the optical proximity correction process S120, the layout pattern pVI1 for the first extended via VI1a may be biased (or changed) to have a greater size. The biased layout pattern pVI1a may have a greater size than that of the layout pattern for the first via VI1.

In the optical proximity correction process S120, based on the biased layout pattern pVI1a, the first extended via VI1a may be achieved on a silicon substrate. The second extended via VI2a may also be achieved by the same method as that for the first extended via VI1a.

Figure 19:
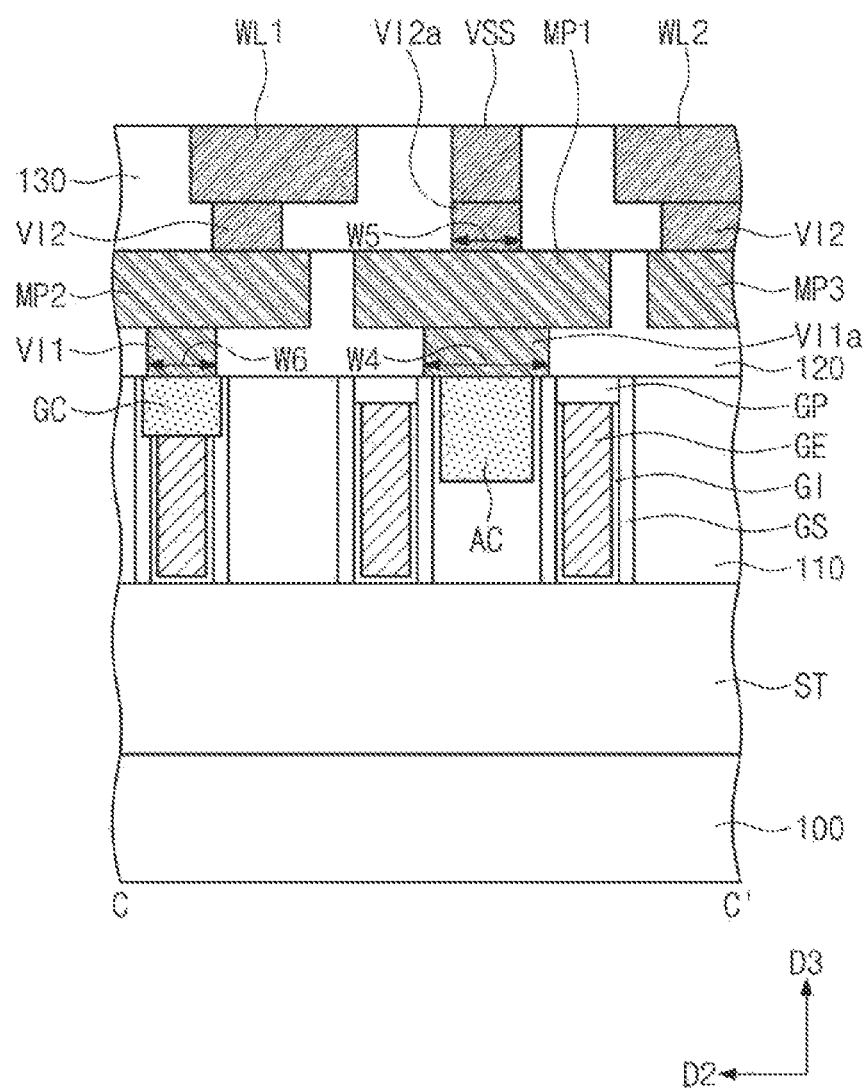
FIG. 19 is a cross-sectional view taken along line C-C' of FIG. 5 for explaining a semiconductor device according to one or more exemplary embodiments.

FIG. 19 is a cross-sectional view taken along line C-C' of FIG. 5 for explaining a semiconductor device according to one or more exemplary embodiments. In the following description, technical features repetitive to those formerly discussed with reference to FIGS. 3, 4, 5, 6A to 6C, 7, and 8 will be omitted and differences will be discussed in detail.

Referring to FIGS. 5, 6A, 6B, and 19, the first extended via VI1a may have a fourth width W4 in the second direction D2, and the second extended via VI2a may have a fifth width W5 in the second direction D2. The first via VI1 may have a sixth width W6 in the second direction D2. The fourth width W4 may be greater than the sixth width W6, and the fourth width W4 may be greater than the fifth width W5. The fifth and sixth widths W5 and W6 may be substantially the same. The first extended via VI1a may have the widths W1 and W4 respectively in the first and second directions D1 and D2 greater than those of the first via VI1. The first extended via VI1a may reduce an electrical resistance of the semiconductor device, and also reduce a process risk of its electrical disconnection to the active contact AC caused by misalignment.

Figure 20:
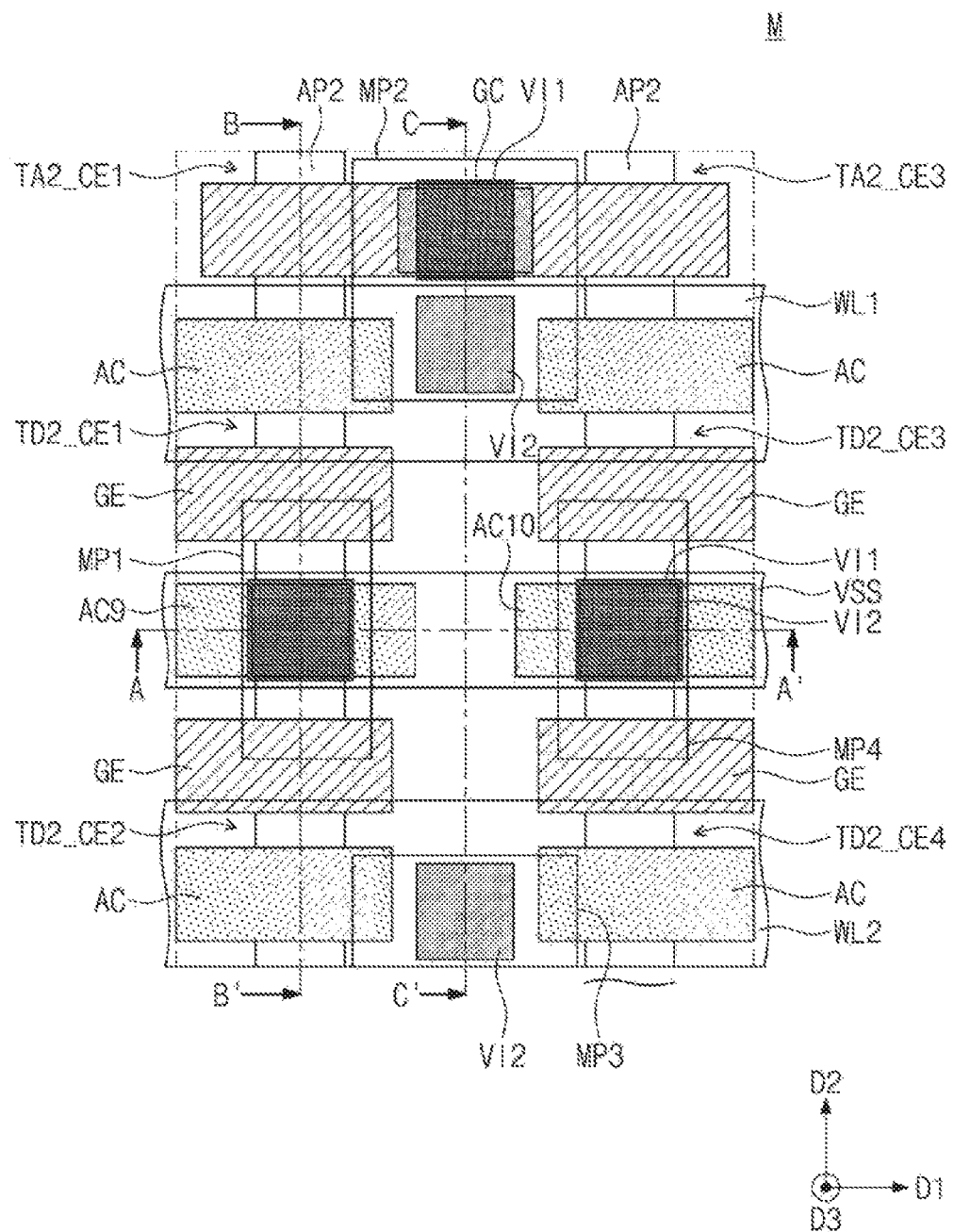
FIG. 20 is an enlarged plan view of section M show in FIG. 4 for explaining a semiconductor device according to one or more exemplary embodiments.
Figure 21A:
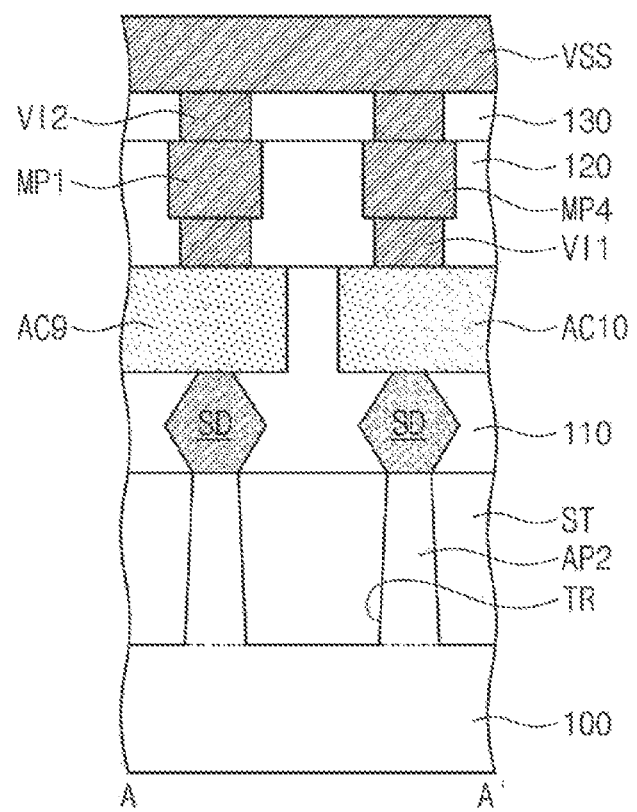
FIGS. 21A, 21B, and 21C are cross-sectional views respectively taken along lines A-A', B-B', and C-C' of FIG. 20.
Figure 21B:
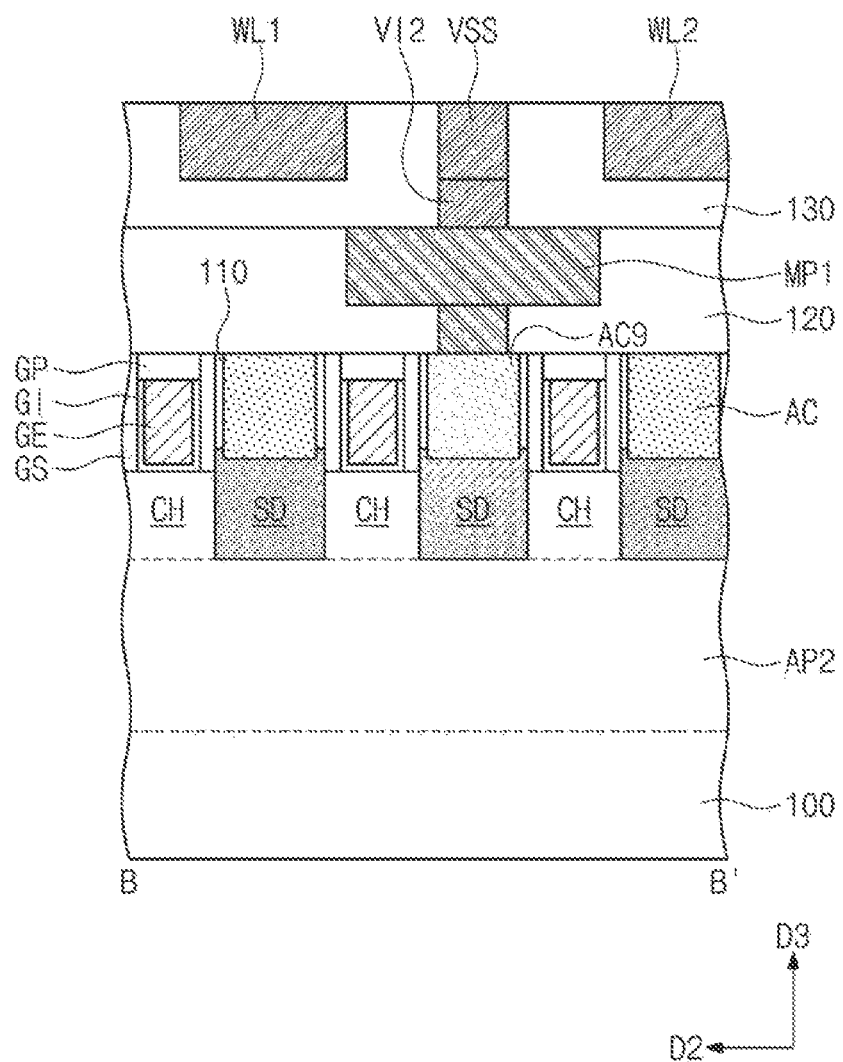
Figure 21C:
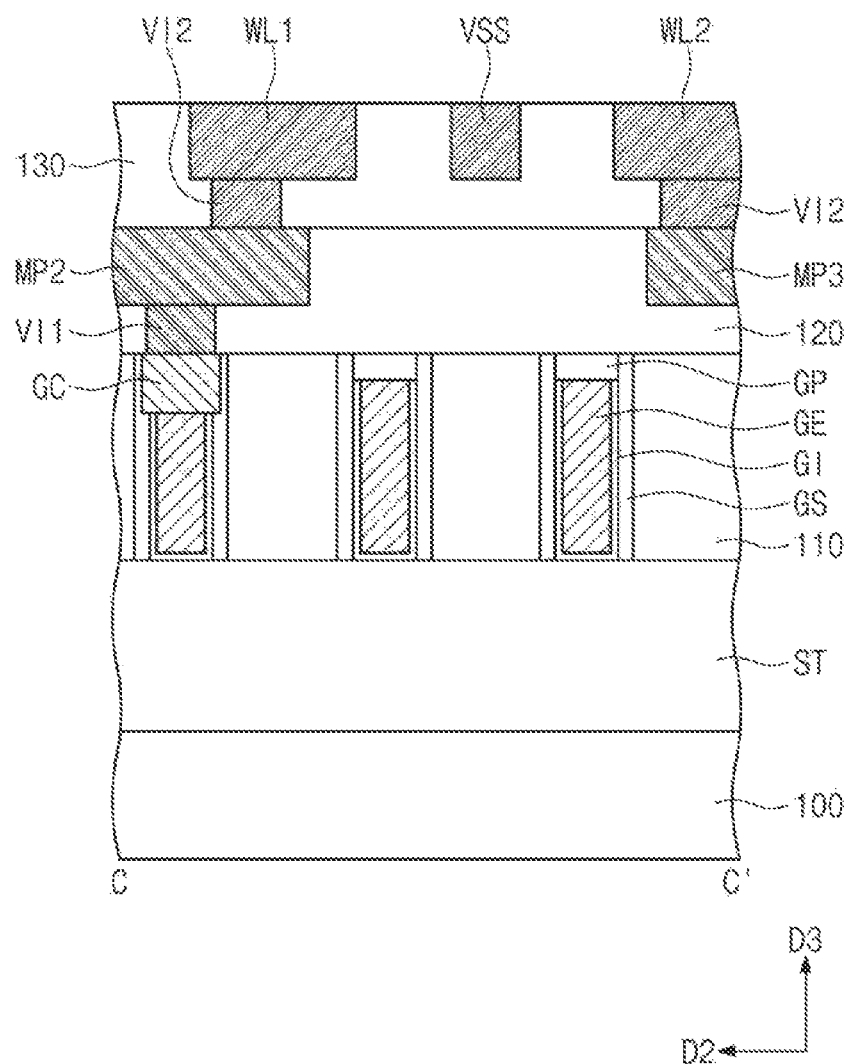

FIG. 20 is an enlarged plan view of section M in FIG. 4 for explaining a semiconductor device according to one or more exemplary embodiments. FIGS. 21A, 21B, and 21C are cross-sectional views respectively taken along lines A-A', B-B', and C-C' of FIG. 20. In the description that follows, technical features repetitive to those formerly discussed with reference to FIGS. 3, 4, 5, 6A to 6C, 7, and 8 will be omitted and differences will be discussed in detail.

Referring to FIGS. 20 and 21A to 21C, a ninth active contact AC9 may be connected to the second source/drains of the second pull-down transistors TD2 included in the first and second bit cells CE1 and CE2. A tenth active contact AC10 may be connected to the second source/drains of the second pull-down transistors TD2 included in the third and fourth bit cells CE3 and CE4. The ninth and tenth active contacts AC9 and AC10 may be spaced apart from each other in the first direction D1.

The first via VI1 and the first conductive pattern MP1 may be provided on the ninth active contact AC9. The first via VI1 and the fourth conductive pattern MP4 may be provided on the tenth active contact AC10. The first and fourth conductive patterns MP1 and MP4 may be spaced apart from each other in the first direction D1.

The second vias VI2 may be provided on the first and fourth conductive patterns MP1 and MP4. The second vias VI2 may electrically connect the first and fourth conductive patterns MP1 and MP4 to the ground line VSS.

The ninth and tenth active contacts AC9 and AC10 may be connected in common to the ground line VSS. In some exemplary embodiments, the ninth contact AC9 may be connected to the ground line VSS through the first via VI1, the first conductive pattern MP1, and the second via VI2, and the tenth active contact AC10 may be connected to the ground line VSS through the first via VI1, the fourth conductive pattern MP4, and the second via VI2, thereby forming two electrical paths. An electrical resistance, such as R in FIG. 3, may be reduced between the ground line VSS and the second source/drains of the second pull-down transistors TD2.

Figure 22:
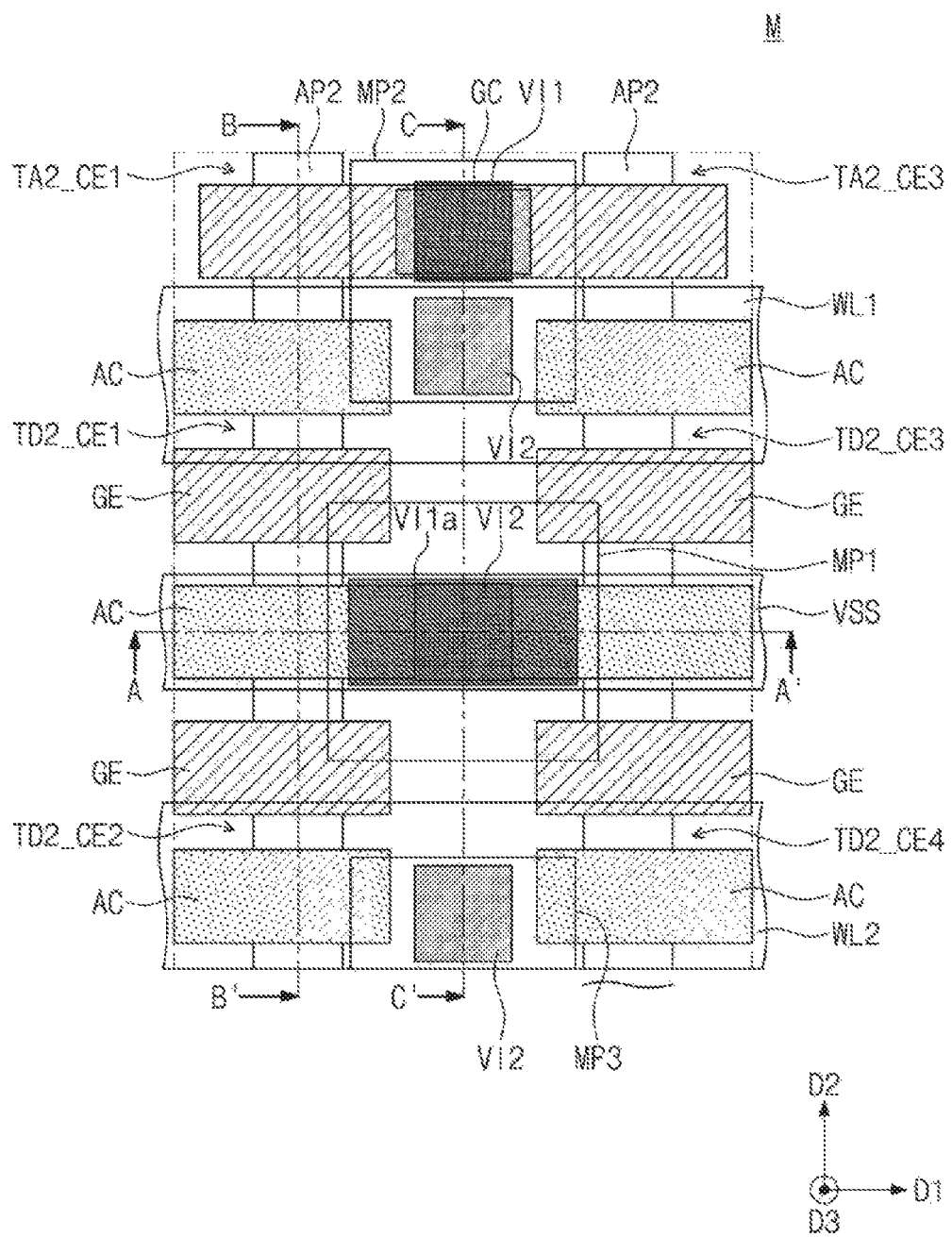
FIG. 22 is an enlarged plan view of section M show in FIG. 4 for explaining a semiconductor device according to one or more exemplary embodiments.
Figure 23:
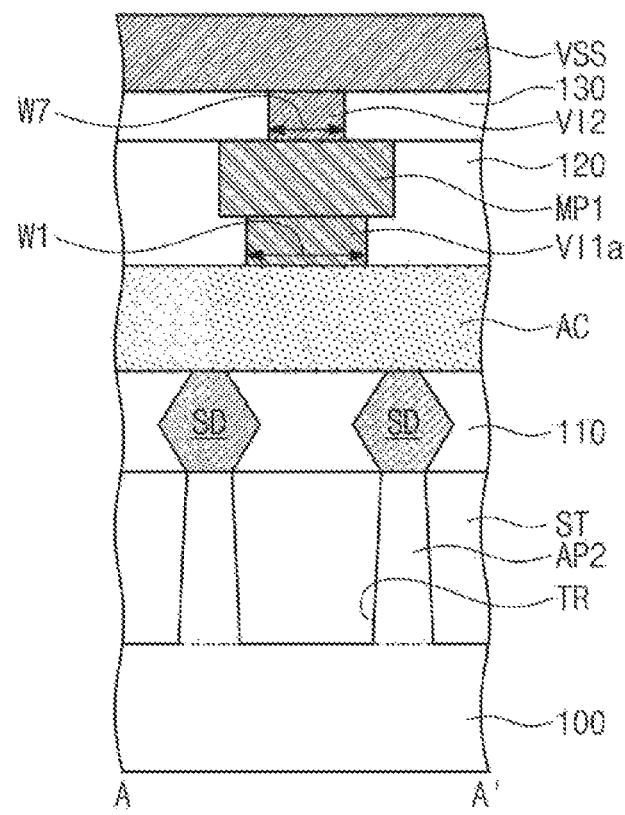
FIG. 23 is a cross-sectional views taken along line A-A' of FIG. 22.

FIG. 22 is an enlarged plan view of section M in FIG. 4 for explaining a semiconductor device according to one or more exemplary embodiments. FIG. 23 is a cross-sectional views taken along line A-A' of FIG. 22. In the following description, technical features repetitive to those formerly discussed with reference to FIGS. 3, 4, 5, 6A to 6C, 7, and 8 will be omitted and differences will be discussed in detail.

Referring to FIGS. 22, 23, 6B and 6C, the second via VI2 may be interposed between the ground line VSS and the first conductive pattern MP1. The ground line VSS may be electrically connected to the second source/drain of the second pull-down transistor TD2 through the second via VI2, the first conductive pattern MP1, the first extended via VI1a, and an active contact AC. The first extended via VI1a may have a first width W1 in a first direction D1. The second via VI2 between the ground line VSS and the first conductive pattern MP1 may have a seventh width W7 in the first direction D1. The seventh width W7 may be substantially equal to the third width W3 of the first via VI1 in the first direction D1 (referring to FIG. 8). The first width W1 may be greater than the seventh width W7.

Figure 24:
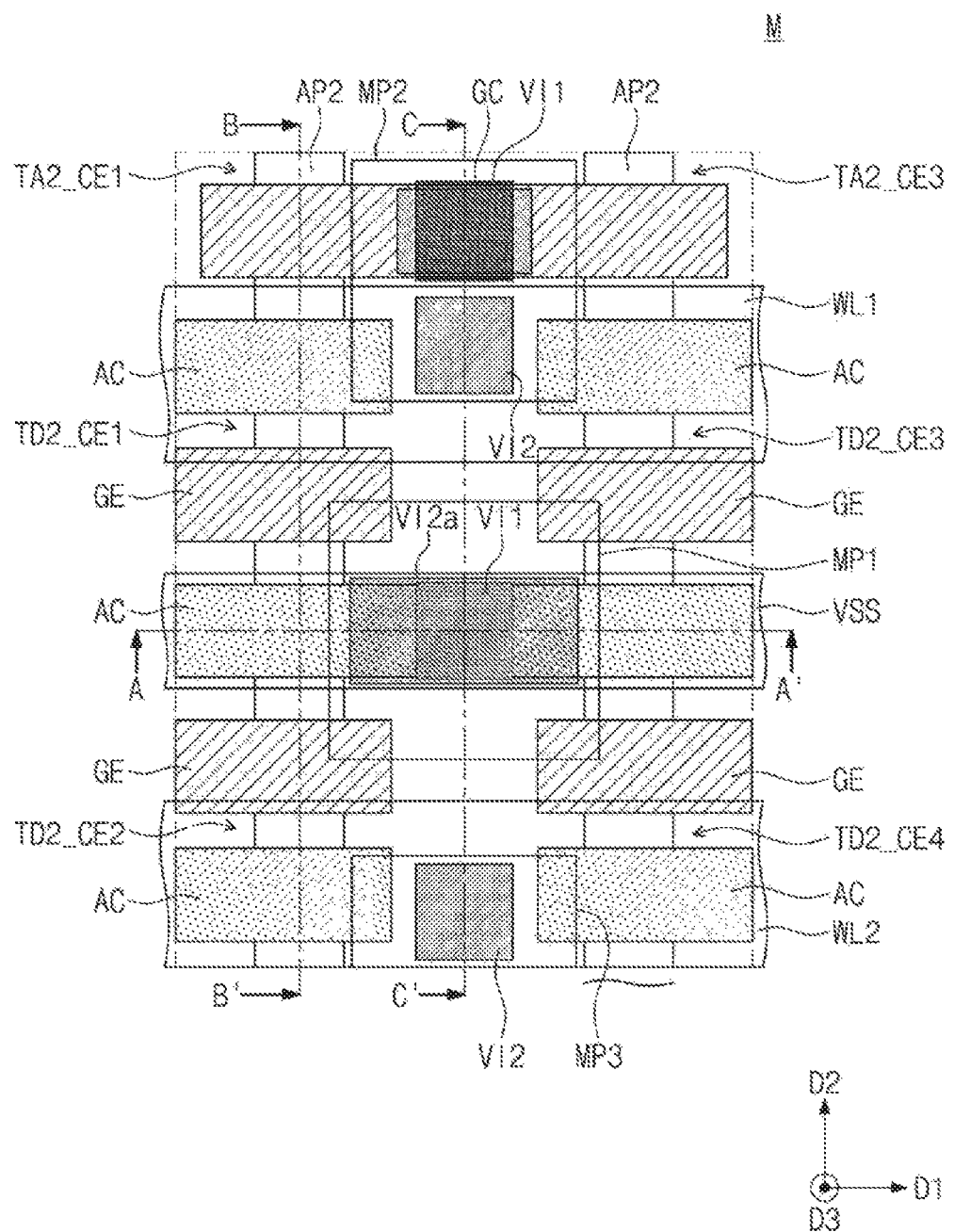
FIG. 24 is an enlarged plan view of section M show in FIG. 4 for explaining a semiconductor device according to one or more exemplary embodiments.
Figure 25:
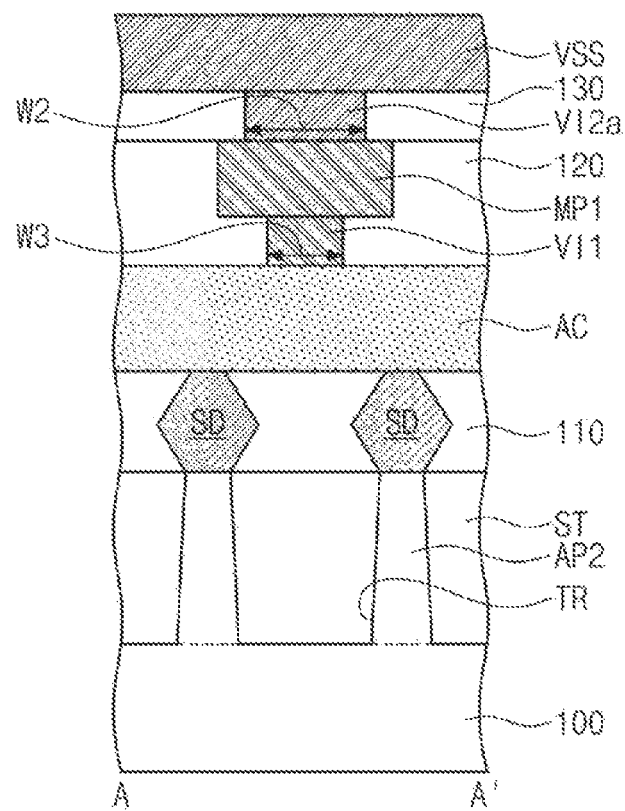
FIG. 25 is a cross-sectional views taken along line A-A' of FIG. 24.

FIG. 24 is an enlarged plan view of section M in FIG. 4 for explaining a semiconductor device according to one or more exemplary embodiments. FIG. 25 is a cross-sectional views taken along line A-A' of FIG. 24. In the following description, technical features repetitive to those formerly discussed with reference to FIGS. 3, 4, 5, 6A to 6C, 7, and 8 will be omitted and differences will be discussed in detail.

Referring to FIGS. 24, 25, 6B and 6C, the first via VI1 may be interposed between the first conductive pattern MP1 and the active contact AC. The ground line VSS may be electrically connected to the second source/drain of the second pull-down transistor TD2 through the second extended via VI2a, the first conductive pattern MP1, the first via VI1, and an active contact AC. The first via VI1 between the first conductive pattern MP1 and the active contact AC may have a third width W3 in a first direction D1. The second extended via VI2a may have a second width W2 in the first direction D1. The second width W2 may be greater than the third width W3.

Figure 26:
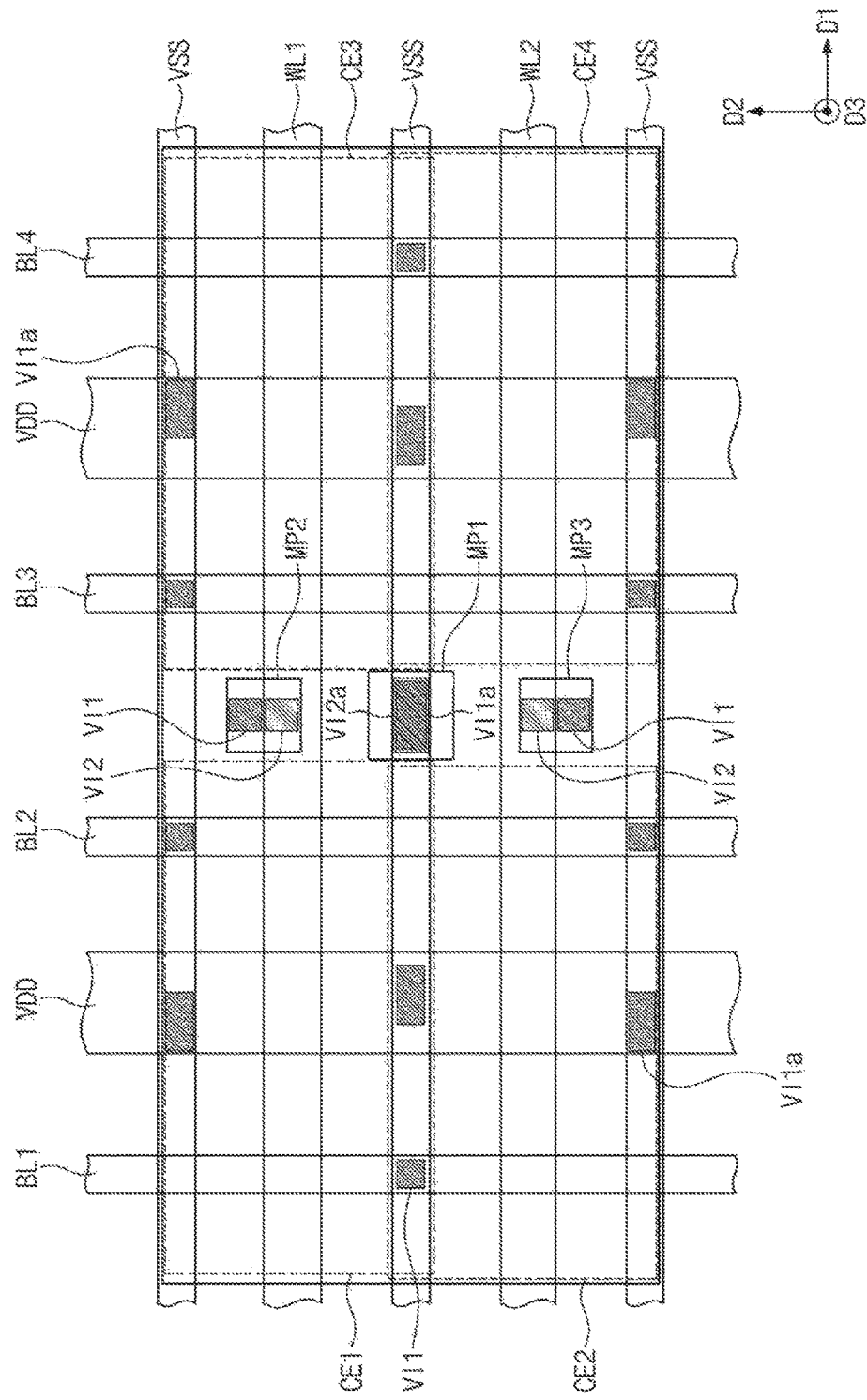
FIG. 26 is a plan view illustrating wiring lines on 2×2 SRAM cells obtained based on the circuit diagram of FIG. 3 for explaining a semiconductor device according to one or more exemplary embodiments.

FIG. 26 is a plan view illustrating wiring lines on 2×2 SRAM cells corresponding to the circuit diagram of FIG. 3 for explaining a semiconductor device according to one or more exemplary embodiments. In the description that follows, technical features repetitive to those formerly discussed above will be omitted and differences will be discussed in detail.

Referring to FIGS. 2, 3, and 26, the first extended vias VI1a may be provided beneath the power lines VDD of the first wiring layer. For example, in the first bit cell CE1, the first extended vias VI1a beneath the power line VDD may be in contact with the fourth and sixth active contacts AC4 and AC6. The second source/drain of the first pull-up transistor TU1 may be connected to the power line VDD through the fourth active contact AC4 and the first extended via VI1a. The second source/drain of the second pull-up transistor TU2 may be connected to the power line VDD through the sixth active contact AC6 and the first extended via VI1a.

In a semiconductor device according to one or more exemplary embodiments, the power line VDD may be electrically connected to the second source/drains of the first and second pull-up transistors TU1 and TU2 through the first extended via VI1a having a relatively greater width. As a result, a semiconductor device may have a reduced electrical resistance.

Moreover, a resistance may be reduced between the memory cell transistor and the ground line, and a parasitic capacitance may also be reduced between the memory cell transistor and the bit line and between the memory cell transistor and the word line.

What is claimed is:
1. A semiconductor device comprising:
a plurality of bit cells on a substrate, the plurality of bit cells comprising a first bit cell, a second bit cell, a third bit cell and a fourth bit cell,
wherein the first bit cell and the second bit cell are adjacent to each other in a first direction,
wherein the first bit cell and the third bit cell are adjacent to each other in a second direction crossing the first direction,
wherein the third bit cell and the fourth bit cell are adjacent to each other in the first direction,
wherein the second bit cell and the fourth bit cell are adjacent to each other in the second direction,
wherein each of the plurality of bit cells comprises a plurality of transistors, the plurality of transistors comprising:
a first access transistor and a second access transistor;
a first pull-up transistor and a second pull-up transistor; and
a first pull-down transistor and a second pull-down transistor,
wherein the first access transistor of the first bit cell and the first access transistor of the second bit cell are connected to a bit line through a first via,
wherein the second pull-down transistor of the first bit cell, the second pull-down transistor of the second bit cell, the second pull-down transistor of the third bit cell, the second pull-down transistor of the fourth bit cell are connected to a ground line through a first extended via, and wherein the first extended via is wider than the first via.

2. The semiconductor device of claim 1, wherein each of the plurality of transistors comprises:
   an active pattern disposed on an upper portion of the substrate and having a fin shape;
   a gate electrode running across the active pattern; and
   source/drain patterns in the active pattern on opposite sides of the gate electrode.

3. The semiconductor device of claim 1, wherein the second pull-down transistor of the first bit cell and the second pull-down transistor of the second bit cell have a common source/drain,
   wherein the second pull-down transistor of the third bit cell and the second pull-down transistor of the fourth bit cell have a common source/drain,
   wherein the common source/drains are electrically connected to each other through an active contact, and
   wherein the active contact is provided beneath and in contact with the first extended via.

4. The semiconductor device of claim 1, wherein a conductive pattern is interposed between the first extended via and the ground line,
   wherein the conductive pattern is disposed at a same level as that of the bit line, and
   wherein the ground line is positioned higher than the conductive pattern and the bit line.

5. The semiconductor device of claim 1, wherein the first pull-up transistor of the first bit cell is connected to a power line through a second extended via, and
   wherein the second extended via is wider than the first via.

6. A semiconductor device comprising:
   a plurality of bit cells on a substrate, the plurality of bit cells comprising a first bit cell, a second bit cell, a third bit cell and a fourth bit cell,
   wherein each of the plurality of bit cells comprises a plurality of transistors, the plurality of transistors comprising an access transistor and a pull-down transistor,
   wherein the access transistor of the first bit cell and the access transistor of the second bit cell are connected to a bit line through a first via,
   wherein the pull-down transistor of the first bit cell, the pull-down transistor of the second bit cell, the pull-down transistor of the third bit cell, the pull-down transistor of the fourth bit cell are connected to a ground line through a first extended via, and
   wherein the first extended via is wider than the first via.

7. The semiconductor device of claim 6, wherein each of the plurality of transistors comprises:
   an active pattern disposed on an upper portion of the substrate and having a fin shape;
   a gate electrode running across the active pattern; and
   source/drain patterns in the active pattern on opposite sides of the gate electrode.

8. The semiconductor device of claim 6, wherein the pull-down transistor of the first bit cell and the pull-down transistor of the second bit cell have a common source/drain,
   wherein the pull-down transistor of the third bit cell and the pull-down transistor of the fourth bit cell have a common source/drain,
   wherein the common source/drains are electrically connected to each other through an active contact, and
   wherein the active contact is provided beneath and in contact with the first extended via.

9. The semiconductor device of claim 6, wherein a conductive pattern is interposed between the first extended via and the ground line,
   wherein the conductive pattern is disposed at a same level as that of the bit line, and
   wherein the ground line is positioned higher than the conductive pattern and the bit line.

10. The semiconductor device of claim 6, wherein the plurality of transistors of each of the plurality of bit cells further comprises a pull-up transistor,
    wherein the pull-up transistor of the first bit cell is connected to a power line through a second extended via, and
    wherein the second extended via is wider than the first via.

* * * * *